(12) United States Patent
Lin et al.

(10) Patent No.: US 12,497,400 B2
(45) Date of Patent: Dec. 16, 2025

(54) ORGANIC COMPOUND, HOLE INJECTION MATERIAL, AND APPLICATION THEREOF

(71) Applicant: Shanghai Tianma Microelectronics Co., Ltd., Shanghai (CN)

(72) Inventors: Yafei Lin, Shanghai (CN); Jinghua Niu, Shanghai (CN); Wanming Hua, Shanghai (CN); Jianyun Wang, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 895 days.

(21) Appl. No.: 17/539,465

(22) Filed: Dec. 1, 2021

(65) Prior Publication Data

US 2022/0093877 A1    Mar. 24, 2022

(30) Foreign Application Priority Data

Jun. 30, 2021   (CN) .......................... 202110737803.5

(51) Int. Cl.
*C07D 487/04*      (2006.01)
*H10K 50/155*    (2023.01)
(Continued)

(52) U.S. Cl.
CPC ........... *C07D 487/04* (2013.01); *H10K 50/17* (2023.02); *H10K 85/654* (2023.02); *H10K 85/6572* (2023.02); *H10K 50/155* (2023.02)

(58) Field of Classification Search
None
See application file for complete search history.

(56) References Cited

U.S. PATENT DOCUMENTS

2002/0121860 A1* 9/2002 Seo ............................ 313/506
2016/0322576 A1  11/2016 Nakayama et al.
(Continued)

FOREIGN PATENT DOCUMENTS

| CN | 103025788 B | 4/2013 |
|---|---|---|
| CN | 106573940 B | 4/2017 |
| KR | 20140027018 A | 3/2014 |

OTHER PUBLICATIONS

Samik Jhulki et al. "Small molecular hole-transporting materials (HTMs) in organic light-emitting diodes (OLEDs): structural diversity and classification", J. Mater. Chem. C, 2018, vol. 6, p. 8280-8325 (Year: 2018).*

(Continued)

*Primary Examiner* — Seokmin Jeon
(74) *Attorney, Agent, or Firm* — KDW Firm PLLC

(57) ABSTRACT

Provided are an organic compound, a hole injection material, and an application thereof. The organic compound has a structure as shown in Formula I or Formula II, and has a deep LUMO energy level through the mutual synergy of nuclear structures and substituents, and the LUMO energy level is close to the anode work function and the HOMO energy level of a hole transport layer, which can effectively promote the generation of holes. Meanwhile, the organic compound has a suitable molecular weight, low volatility, high thermal stability, and can satisfy the vacuum evaporation requirements for the OLED device preparation. The organic compound is applied to the OLED device, especially suitable as a P-type dopant for a hole injection layer, which can effectively control the charge balance in the device, significantly reduce the drive voltage of the device, prolong the working life, and enable the device to have higher luminous performance.

17 Claims, 1 Drawing Sheet

(51) Int. Cl.
*H10K 50/17* (2023.01)
*H10K 85/60* (2023.01)

(56) References Cited

U.S. PATENT DOCUMENTS

2023/0006169 A1\* 1/2023 Karri ................... H01L 51/529
2024/0172557 A1\* 5/2024 Langguth ............ H10K 85/654

OTHER PUBLICATIONS

English translation of KR 2020/0022963 A and the original KR 2020/0022963 A, Mar. 4, 2020, Seo-Yong Hyun (Year: 2020).\*
English translation of CN 110746364 A and the original CN 110746364 A, Feb. 4, 2020, Xinlong Song (Year: 2020).\*

\* cited by examiner

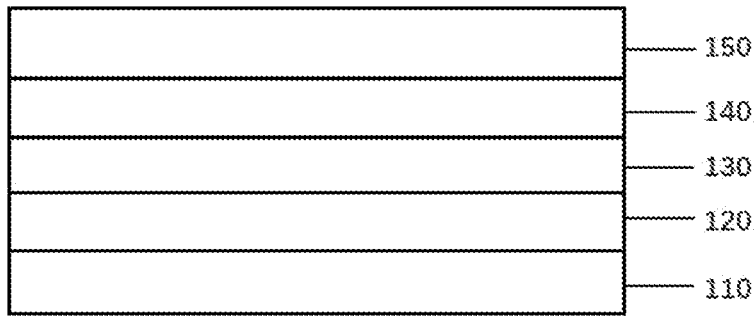

ORGANIC COMPOUND, HOLE INJECTION MATERIAL, AND APPLICATION THEREOF

CROSS-REFERENCE TO RELATED APPLICATIONS

The application claims the benefit of the earlier filing date of Chinese Patent Application No. CN202110737803.5, filed on Jun. 30, 2021 to the China National Intellectual Property Administration (CNIPA), the contents of which are incorporated by reference herein in its entirety.

TECHNICAL FIELD

The present disclosure belongs to the technical field of organic electroluminescent materials, and specifically, relates to an organic compound, an electroluminescent material, and an application thereof.

BACKGROUND

With the advent of the organic light-emitting diode (OLED), the OLED has attracted wide attention from researchers and enterprise researchers due to its advantages such as self-luminescence, low power consumption, high contrast, wide color gamut, flexibility, and foldability. The OLED technology has developed by leaps and bounds, has been successfully applied in business, and has been widely used in various industries such as flexible display, flat panel display, and solid-state lighting.

The OLED device is usually a stacked structure composed of multiple organic film layers, that is, multiple organic film layers are arranged between the cathode and the anode, and the organic film layers include a light emitting layer and other functional layers such as an electron transport layer, a hole transport layer, a hole injection layer, and an electron injection layer to assist transmission. The OLED device works as follows: when a voltage is applied between the anode and the cathode, holes are injected into the light emitting layer from the anode through the hole injection layer and the hole transport layer, electrons are injected into the light emitting layer from the cathode through the electron injection layer and the electron transport layer, and the holes and electrons injected into the light emitting layer recombine in the light emitting layer to generate excitons which emit light while changing from the excited state to the ground state.

In the OLED device, the relatively low carrier mobility of the organic film layers has a direct impact on the drive voltage of the device and also affects the thermal load of the light-emitting device, which thus affects the brightness decay life of the light-emitting device. Therefore, the material selection and properties of the organic film layers have a great influence on the luminescence properties of the OLED device.

Therefore, it is an urgent problem to be solved to develop more types of organic electroluminescent materials with higher performance in the art.

SUMMARY

To develop more types of organic electroluminescent materials with better performance, a first aspect of the present disclosure is to provide an organic compound having a structure as shown in Formula I or Formula II:

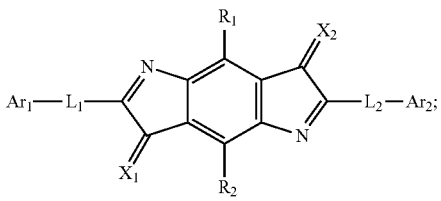

Formula I

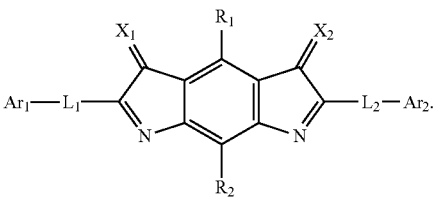

Formula II

In the above formulas, $X_1$ and $X_2$ are each independently selected from O, NR' or CR" R'''.

R', R", and R''' are electron withdrawing groups and each independently selected from any one of halogen, a cyano group, an isocyano group, a $R^{X1}$-substituted C1 to C20 linear or branched alkyl group, a $R^{X1}$-substituted C1 to C20 alkoxyl group, a $R^{X2}$-substituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, or a substituted or unsubstituted C6 to C30 arylphosphonoxy group.

$R^{X1}$ is selected from fluorine, a cyano group or an isocyano group.

$R^{X2}$ is selected from any one of fluorine, a cyano group, an isocyano group, a fluorine-substituted C1 to C20 alkoxyl group or a fluorine-substituted C1 to C20 linear or branched alkyl group.

$L_1$ and $L_2$ are each independently selected from any one of a single bond, a substituted or unsubstituted C6 to C30 arylene group, or a substituted or unsubstituted C3 to C30 heteroarylene group, where "$L_1$ is a single bond" means that $Ar_1$ is directly linked to a fused-ring structure, and "$L_2$ is a single bond" means that $Ar_2$ is directly linked to a fused-ring structure.

$R_1$ and $R_2$ are each independently selected from any one of hydrogen, deuterium, halogen, a cyano group, a substituted or unsubstituted C1 to C20 linear or branched alkyl group, a substituted or unsubstituted C3 to C20 cycloalkyl group, a substituted or unsubstituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, a substituted or unsubstituted C6 to C30 arylphosphonoxy group, a substituted or unsubstituted C3 to C20 alkylsilyl group, or a substituted or unsubstituted C6 to C30 arylsilyl group.

$Ar_1$ and $Ar_2$ are each independently selected from any one of a substituted or unsubstituted C6 to C30 aryl group, or a substituted or unsubstituted C3 to C30 heteroaryl group.

In the present disclosure, C1 to C20 may each independently be C1, C2, C3, C4, C5, C6, C7, C8, C9, C10, C12, C14, C15, C16, C18, etc.

C6 to C30 may each independently be C6, C8, C10, C12, C13, C14, C15, C16, C18, C20, C22, C24, C26, C28, etc.

C3 to C30 may each independently be C3, C4, C5, C6, C8, C10, C12, C13, C14, C15, C16, C18, C20, C22, C24, C26, C28, etc.

C4 to C30 may each independently be C4, C5, C6, C8, C10, C12, C13, C14, C15, C16, C18, C20, C22, C24, C26, C28, etc.

C3 to C20 may each independently be C3, C4, C5, C6, C7, C8, C9, C10, C12, C14, C15, C16, C18, etc.

In the present disclosure, the halogen includes fluorine, chlorine, bromine or iodine.

In the present disclosure, the "electron withdrawing group" refers to a group capable of reducing an electron cloud density on a benzene ring and for example, includes halogen, a cyano group, an isocyano group, a cyano-substituted group (for example, an alkyl group, an alkoxyl group, an aryl group, a heteroaryl group, etc.), an isocyano-substituted group (for example, an alkyl group, an alkoxyl group, an aryl group, a heteroaryl group, etc.), a nitrogen-containing heteroaryl group (for example, a triazinyl group, a pyrazinyl group, a pyrimidinyl group, a pyridazinyl group, a quinolyl group, a isoquinolyl group, a benzopyrazinyl group, a benzopyridazinyl group, a benzopyrimidinyl group, a pyridopyridinyl group, a pyridopyrazinyl group, etc.), a fluorine-containing substituent group (for example, fluorine, a trifluoromethyl group or a perfluoroethyl group, etc.), an aryl group or a heteroaryl group substituted by a fluorine-containing substituent group, an aryl keto group, a heteroaryl keto group, an arylsulfone group, an arylphosphonoxy group, etc.

The organic compound provided by the present disclosure takes indolopyrrole as the parent nuclear structure, and electron withdrawing groups are introduced into the parent nuclear structure, which endows the organic compound with more excellent photoelectric properties so that the lowest unoccupied molecular orbital energy level (LUMO energy level) of the organic compound is close to the work function of the anode and the highest occupied molecular orbital energy level (HOMO energy level) of the hole transport layer, which can effectively promote the generation of holes. The organic compound has low volatility and can fully satisfy the vacuum evaporation requirements for the production of the OLED device. As an organic electroluminescent material, the organic compound is especially suitable to be used as a P-type charge dopant, which can effectively improve the voltage and lifetime of the device.

A second aspect of the present disclosure is to provide a hole injection material including the organic compound, wherein the organic compound having a structure as shown in Formula I or Formula II:

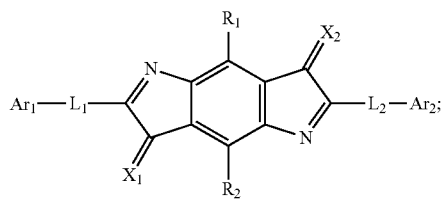

Formula I

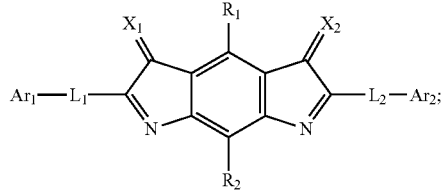

Formula II wherein $X_1$ and $X_2$ are each independently selected from O, NR' or CR"R''';

wherein R', R", and R''' are electron withdrawing groups and each independently selected from any one of halogen, a cyano group, an isocyano group, a $R^{X1}$-substituted C1 to C20 linear or branched alkyl group, a $R^{X1}$-substituted C1 to C20 alkoxyl group, a $R^{X2}$-substituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, or a substituted or unsubstituted C6 to C30 arylphosphonoxy group;

wherein $R^{X1}$ is selected from fluorine, a cyano group or an isocyano group;

wherein $R^{X2}$ is selected from any one of fluorine, a cyano group, an isocyano group, a fluorine-substituted C1 to C20 alkoxyl, or a fluorine-substituted C1 to C20 linear or branched alkyl group;

wherein $L_1$ and $L_2$ are each independently selected from any one of a single bond, a substituted or unsubstituted C6 to C30 arylene group, or a substituted or unsubstituted C3 to C30 heteroarylene group;

wherein $R_1$ and $R_2$ are each independently selected from any one of hydrogen, deuterium, halogen, a cyano group, a substituted or unsubstituted C1 to C20 linear or branched alkyl group, a substituted or unsubstituted C3 to C20 cycloalkyl group, a substituted or unsubstituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, a substituted or unsubstituted C6 to C30 arylphosphonoxy group, a substituted or unsubstituted C3 to C20 alkylsilyl group, or a substituted or unsubstituted C6 to C30 arylsilyl group; and wherein $Ar_1$ and $Ar_2$ are each independently selected from any one of a substituted or unsubstituted C6 to C30 aryl group, or a substituted or unsubstituted C3 to C30 heteroaryl group.

A third aspect of the present disclosure is to provide an OLED device. The OLED device includes an anode, a cathode, and an organic thin film layer located between the anode and the cathode, and the material of the organic thin film layer includes the hole injection material as described in the second aspect.

A fourth aspect of the present disclosure is to provide a display panel including the OLED device as described in the third aspect.

BRIEF DESCRIPTION OF DRAWINGS

The FIGURE is a structural schematic diagram of an OLED device according to the present disclosure.

REFERENCE LIST

110 anode
120 first organic functional layer
130 light emitting layer
140 second organic functional layer
150 cathode

DETAILED DESCRIPTION

The technical solutions of the present disclosure are further described below through particular embodiments. Those skilled in the art should understand that the embodiments described herein are used for a better understanding of the present disclosure and should not be construed as specific limitations to the present disclosure.

In the related art, the carrier density and carrier mobility in the light-emitting device can be significantly improved by doping the hole transport layer with an appropriate electron acceptor material (P-type doping) or doping the electron transport layer with an electron donor material (N-type doping), thereby improving the luminescence efficiency of the device, wherein P-type doping materials facilitates the injection of holes from the anode to the hole transport layer. At present, various P-type dopants have been developed and utilized, such as F4-TCNQ

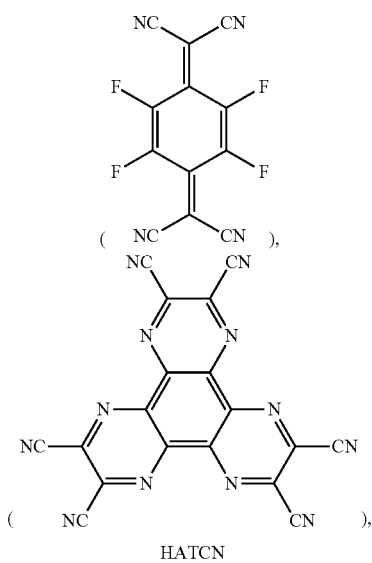

HATCN and so on. However, the existing P-type doping materials have the disadvantages of low vacuum deposition temperature and high volatility, which will pollute the deposition chamber during the preparation of the OLED device. Moreover, the photoelectric properties of the P-type doping materials are not ideal, which cannot effectively reduce the drive voltage of the OLED device and does not have an obvious improvement effect on the luminescence efficiency of the device. Therefore, the existing P-type doping materials have not been widely applied. In order to develop more types of organic electroluminescent materials with better performance, the present invention provides the following technical solutions.

A first aspect of the present disclosure is to provide an organic compound having a structure as shown in Formula I or Formula II:

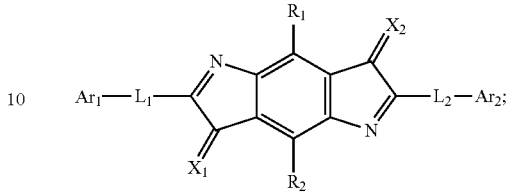

Formula I

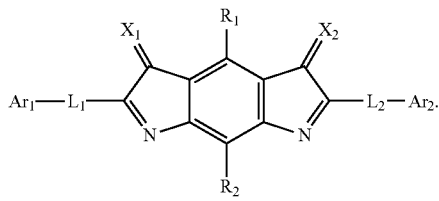

Formula II

In the above formulas, X1 and X2 are each independently selected from O, NR' or CR'' R'''.

R', R'', and R''' are electron withdrawing groups and each independently selected from any one of halogen, a cyano group, an isocyano group, a $R^{X1}$-substituted C1 to C20 linear or branched alkyl group, a $R^{X1}$-substituted C1 to C20 alkoxyl, a $R^{X2}$-substituted C6 to C30 aryl, a substituted or unsubstituted C3 to C30 heteroaryl, a substituted or unsubstituted C6 to C30 aryl keto group, a substituted or unsubstituted C4 to C30 heteroaryl keto group, a substituted or unsubstituted C6 to C30 arylsulfone group, or a substituted or unsubstituted C6 to C30 arylphosphonoxy group.

$R^{X1}$ is selected from fluorine, a cyano group or an isocyano group.

$R^{X2}$ is selected from any one of fluorine, a cyano group, an isocyano group, a fluorine-substituted C1 to C20 alkoxyl, or a fluorine-substituted C1 to C20 linear or branched alkyl group.

$L_1$ and $L_2$ are each independently selected from any one of a single bond, a substituted or unsubstituted C6 to C30 arylene group, or a substituted or unsubstituted C3 to C30 heteroarylene group, where "$L_1$ is a single bond" means that $Ar_1$ is directly linked to a fused-ring structure, and "$L_2$ is a single bond" means that $Ar_2$ is directly linked to a fused-ring structure.

$R_1$ and $R_2$ are each independently selected from any one of hydrogen, deuterium, halogen, a cyano group, a substituted or unsubstituted C1 to C20 linear or branched alkyl group, a substituted or unsubstituted C3 to C20 cycloalkyl group, a substituted or unsubstituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, a substituted or unsubstituted C6 to C30 arylphosphonoxy group, a substituted or unsubstituted C3 to C20 alkylsilyl group, or a substituted or unsubstituted C6 to C30 arylsilyl group.

$Ar_1$ and $Ar_2$ are each independently selected from any one of a substituted or unsubstituted C6 to C30 aryl group, or a substituted or unsubstituted C3 to C30 heteroaryl group.

In the present disclosure, C1 to C20 may each independently be C1, C2, C3, C4, C5, C6, C7, C8, C9, C10, C12, C14, C15, C16, C18, etc.

C6 to C30 may each independently be C6, C8, C10, C12, C13, C14, C15, C16, C18, C20, C22, C24, C26, C28, etc.

C3 to C30 may each independently be C3, C4, C5, C6, C8, C10, C12, C13, C14, C15, C16, C18, C20, C22, C24, C26, C28, etc.

C4 to C30 may each independently be C4, C5, C6, C8, C10, C12, C13, C14, C15, C16, C18, C20, C22, C24, C26, C28, etc.

C3 to C20 may each independently be C3, C4, C5, C6, C7, C8, C9, C10, C12, C14, C15, C16, C18, etc.

In the present disclosure, the halogen includes fluorine, chlorine, bromine or iodine. The same expression hereinafter has the same meaning.

In the present disclosure, the "electron withdrawing group" refers to a group capable of reducing an electron cloud density on a benzene ring and for example, includes halogen, a cyano group, an isocyano group, a cyano-substituted group (such as an alkyl group, an alkoxyl group, an aryl group, a heteroaryl group, etc.), an isocyano-substituted group (such as an alkyl group, an alkoxyl group, an aryl group, a heteroaryl group, etc.), a nitrogen-containing heteroaryl group (such as a triazinyl group, a pyrazinyl group, a pyrimidinyl group, a pyridazinyl group, a quinolyl group, an isoquinolyl group, a quinoxalinyl group, a quinazolinyl group, a benzopyridazinyl group, a pyridopyridinyl group, a pyridopyrazinyl group, an oxadiazolyl group, a thiadiazolyl group, etc.), a fluorine-containing substituent group (such as fluorine, a trifluoromethyl group or a perfluoroethyl group, etc.), an aryl group or a heteroaryl group substituted by a fluorine-containing substituent group, an aryl keto group, a heteroaryl keto group, an arylsulfone group, an arylphosphonoxy group, etc.

The organic compound provided by the present disclosure has the structure as shown in Formula I or Formula II and takes indolopyrrole as the parent nuclear structure into which $X_1$ and $X_2$ with strong electron withdrawing properties are introduced. Through the synergistic effect of the parent nuclear structure and substituent groups, the organic compound has a deep LUMO energy level, where the LUMO energy level reaches −4.8 eV to −5.34 eV, and the HOMO energy level reaches −6.97 eV to −7.64 eV. The LUMO energy level of the organic compound is close to the work function of the anode and the HOMO energy level of the hole transport layer, and thus the organic compound can be used as the P-type dopant in the charge injection layer (hole injection layer) of the OLED device, which can effectively control the charge balance in the OLED device, thus reducing the drive voltage of the device and prolonging the working life. At the same time, the molecular weight of the organic compound reaches 500 g/mol to 1000 g/mol, and the organic compound has low volatility and good thermal stability and can fully satisfy the vacuum evaporation requirements for the preparation of the OLED device. Therefore, the organic compound has broad mass production application prospects.

In an embodiment, the substituted heteroaryl group, the substituted aryl keto group, the substituted heteroaryl keto group, the substituted arylsulfone group, and the substituted arylphosphonoxy group in R', R", and R''' are each independently selected from at least one of deuterium, halogen, a cyano group, an isocyano group, an unsubstituted or $R^{X3}$-substituted C1 to C10 (for example, C1, C2, C3, C4, C5, C6, C7, C8, C9, etc.) linear or branched alkyl group, an unsubstituted or $R^{X3}$-substituted C1 to C10 (for example, C1, C2, C3, C4, C5, C6, C7, C8, C9, etc.) alkoxyl group, an unsubstituted or $R^{X3}$-substituted C1 to C10 (for example, C1, C2, C3, C4, C5, C6, C7, C8, C9, etc.) alkylthio group, an unsubstituted or $R^{X3}$-substituted C6 to C18 (for example, C6, C9, C10, C12, C14, C16, C18, etc.) aryl group, or an unsubstituted or $R^{X3}$-substituted C3 to C18 (for example, C3, C4, C5, C6, C8, C10, C12, C14, C16, C18, etc.) heteroaryl group.

The substituted substituent groups in $L_1$, $L_2$, $R_1$, $R_2$, $Ar_1$, and $Ar_2$ are each independently selected from at least one of deuterium, halogen, a cyano group, an isocyano group, an unsubstituted or $R^{X3}$-substituted C1 to C10 (for example, C1, C2, C3, C4, C5, C6, C7, C8, C9, etc.) linear or branched alkyl group, an unsubstituted or $R^{X3}$-substituted C1 to C10 (for example, C1, C2, C3, C4, C5, C6, C7, C8, C9, etc.) alkoxyl group, an unsubstituted or $R^{X3}$-substituted C1 to C10 (for example, C1, C2, C3, C4, C5, C6, C7, C8, C9, etc.) alkylthio group, an unsubstituted or $R^{X3}$-substituted C6 to C18 (for example, C6, C9, C10, C12, C14, C16, C18, etc.) aryl group, an unsubstituted or $R^{X3}$-substituted C3 to C18 (for example, C3, C4, C5, C6, C8, C10, C12, C14, C16, C18, etc.) heteroaryl group, and C6 to C18 (for example, C6, C9, C10, C12, C14, C16, C18, etc.) arylamine group.

$R^{X3}$ is selected from any one of a halogen-containing group, a cyano group (—CN) or an isocyano group (—NC).

In the present disclosure, the halogen-containing group includes halogen, a halogen-substituted alkyl group, or a halogen-substituted alkoxyl group, for example, fluorine, chlorine, bromine, iodine, a trifluoromethyl group, a perfluoroethyl group, a trifluoromethoxy group or a perfluoroethoxy group, etc., and further preferably, fluorine, a trifluoromethyl group or a trifluoromethoxy group.

In an embodiment, R', R", and R''' are each independently selected from any one of fluorine, a cyano group, an isocyano group, a fluorine-substituted C1 to C6 alkoxyl group, or a fluorine-substituted C1 to C6 linear or branched alkyl group.

In the present disclosure, the fluorine-substituted C1 to C6 alkoxyl group includes a fluorine-substituted C1, C2, C3, C4, C5 or C6 alkoxyl group, and for example, includes, but is not limited to, trifluoromethoxy, perfluoroethoxy, perfluoropropoxy, perfluorobutoxy, etc.

In the present disclosure, the fluorine-substituted C1 to C6 linear or branched alkyl group includes a fluorine-substituted C1, C2, C3, C4, C5 or C6 linear or branched alkyl group, and for example, includes, but is not limited to, trifluoromethyl, perfluoroethyl, fluoro-n-propyl, fluoro-isopropyl, fluoro-n-butyl, fluoro-tert-butyl, fluoro-isobutyl, fluoro-n-amyl, fluoro-isoamyl, fluoro-neopentyl, fluoro-n-hexyl, etc.

In an embodiment, R', R", and R''' are each independently selected from any one of the following groups:

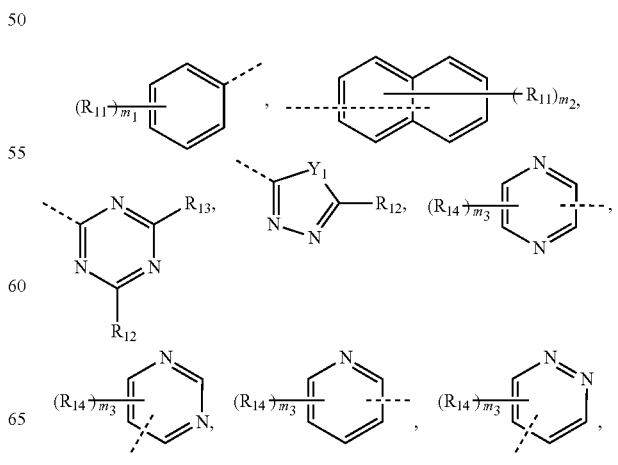

In the above groups, the dashed line represents a linkage site of a group.

$Y_1$ is selected from O, S or $NR_N$.

$R_{11}$ is selected from any one of fluorine, a cyano group, an isocyano group, a fluorine-substituted C1 to C6 (for example, C1, C2, C3, C4, C5 or C6) alkoxyl group, or a fluorine-substituted C1 to C6 (for example, C1, C2, C3, C4, C5 or C6) linear or branched alkyl group.

$R_{12}$, $R_{13}$, and $R_N$ are each independently selected from any one of hydrogen, deuterium, halogen, a cyano group, an isocyano group, an unsubstituted or $R^{X3}$-substituted C1 to C10 (for example, C1, C2, C3, C4, C5, C6, C7, C8, C9, etc.) linear or branched alkyl group, an unsubstituted or $R^{X3}$-substituted C1 to C10 (for example, C1, C2, C3, C4, C5, C6, C7, C8, C9, etc.) alkoxyl group, an unsubstituted or $R^{X3}$-substituted C1 to C10 (for example, C1, C2, C3, C4, C5, C6, C7, C8, C9, etc.) alkylthio group, an unsubstituted or $R^{X3}$-substituted C6 to C18 (for example, C6, C9, C10, C12, C14, C16, C18, etc.) aryl group, or an unsubstituted or $R^3$-substituted C3 to C18 (for example, C3, C4, C5, C6, C8, C10, C12, C14, C16, C18, etc.) heteroaryl group.

$R_{14}$ is selected from any one of deuterium, halogen, a cyano group, an isocyano group, an unsubstituted or $R^{X3}$-substituted C1 to C10 (for example, C1, C2, C3, C4, C5, C6, C7, C8, C9, etc.) linear or branched alkyl group, an unsubstituted or $R^{X3}$-substituted C1 to C10 (for example, C1, C2, C3, C4, C5, C6, C7, C8, C9, etc.) alkoxyl group, an unsubstituted or $R^{X3}$-substituted C1 to C10 (for example, C1, C2, C3, C4, C5, C6, C7, C8, C9, etc.) alkylthio group, an unsubstituted or $R^{X3}$-substituted C6 to C18 (for example, C6, C9, C10, C12, C14, C16, C18, etc.) aryl group, or an unsubstituted or $R^{X3}$-substituted C3 to C18 (for example, C3, C4, C5, C6, C8, C10, C12, C14, C16, C18, etc.) heteroaryl group.

$R^{X3}$ is selected from any one of halogen, a cyano group or an isocyano group.

$m_1$ is an integer selected from 1 to 5 and for example, may be 1, 2, 3, 4 or 5.

$m_2$ is an integer selected from 1 to 7 and for example, may be 1, 2, 3, 4, 5, 6 or 7.

$m_3$ is an integer selected from 0 to 3 and for example, may be 0, 1, 2 or 3.

$m_4$ is an integer selected from 0 to 6 and for example, may be 0, 1, 2, 3, 4, 5 or 6.

$m_5$ is an integer selected from 0 to 5 and for example, may be 0, 1, 2, 3, 4 or 5.

In an embodiment, R', R", and R'" are each independently selected from any one of fluorine, a cyano group, an isocyano group, a fluorine-substituted C1 to C6 (for example, C1, C2, C3, C4, C5 or C6) alkoxyl group, a fluorine-substituted C1 to C6 (for example, C1, C2, C3, C4, C5 or C6) linear or branched alkyl group,

where the dashed line represents a linkage site of the group.

In an embodiment, $X_1$ and $X_2$ are each independently selected from NR' or CR"R'".

In an embodiment, R', R", and R'" are each independently selected from a cyano group or an isocyano group.

In an embodiment, $X_1$ and $X_2$ both are

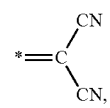

where * represents a linkage site of the group. The organic compound has a structure as shown in Formula I-1 or Formula II-1:

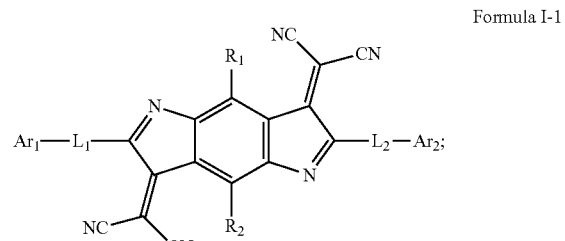

Formula I-1

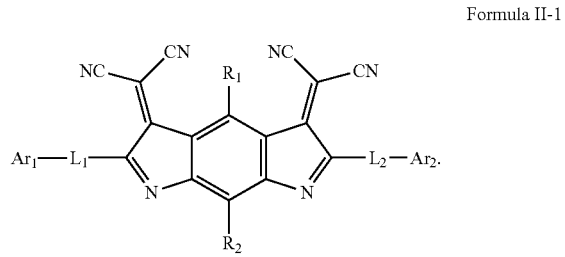

Formula II-1

As a preferred embodiment of the present disclosure, $X_1$ and $X_2$ both are

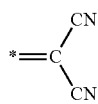

which has a strong electron withdrawing ability and high stability, and thus as the P-type doping material, the organic compound facilitates the improvement of the working life and drive voltage of the OLED device.

In an embodiment, $L_1$ and $L_2$ are each independently selected from a single bond, a phenylene group, a biphenylene group or a naphthylene group.

In an embodiment, $R_1$ and $R_2$ are each independently selected from any one of hydrogen, deuterium, halogen, a cyano group, a fluorine-substituted C1 to C6 (for example, C1, C2, C3, C4, C5 or C6) alkoxyl group, or a fluorine-substituted C1 to C6 (for example, C1, C2, C3, C4, C5 or C6) linear or branched alkyl group.

In an embodiment, $Ar_1$ and $Ar_2$ are each independently selected from any one of the following groups:

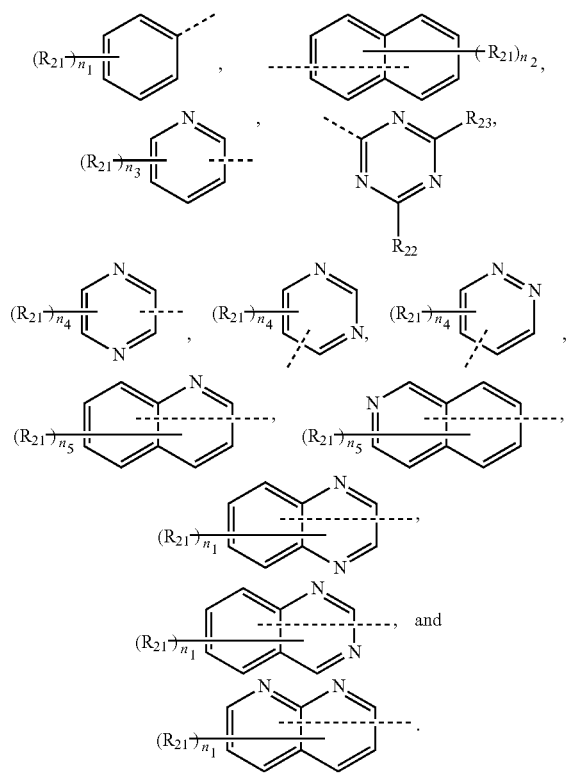

In the above groups, the dashed line represents a linkage site of the group.

$R_{21}$ is selected from any one of deuterium, halogen, a cyano group, an isocyano group, an unsubstituted or $R^{X3}$-substituted C1 to C10 (for example, C1, C2, C3, C4, C5, C6, C7, C8, C9, etc.) linear or branched alkyl group, an unsubstituted or $R^{X3}$-substituted C1 to C10 (for example, C1, C2, C3, C4, C5, C6, C7, C8, C9, etc.) alkoxyl group, an unsubstituted or $R^{X3}$-substituted C1 to C10 (for example, C1, C2, C3, C4, C5, C6, C7, C8, C9, etc.) alkylthio group, an unsubstituted or $R^{X3}$-substituted C6 to C18 (for example, C6, C9, C10, C12, C14, C16, C18, etc.) aryl group, or an unsubstituted or $R^{X3}$-substituted C3 to C18 (for example, C3, C4, C5, C6, C8, C10, C12, C14, C16, C18, etc.) heteroaryl group.

$R_{22}$ and $R_{23}$ are each independently selected from any one of hydrogen, deuterium, halogen, a cyano group, an isocyano group, an unsubstituted or $R^{X3}$-substituted C1 to C10 (for example, C1, C2, C3, C4, C5, C6, C7, C8, C9, etc.) linear or branched alkyl group, an unsubstituted or $R^{X3}$-substituted C1 to C10 (for example, C1, C2, C3, C4, C5, C6, C7, C8, C9, etc.) alkoxyl group, an unsubstituted or $R^{X3}$-substituted C1 to C10 (for example, C1, C2, C3, C4, C5, C6, C7, C8, C9, etc.) alkylthio group, an unsubstituted or $R^{X3}$-substituted C6 to C18 (for example, C6, C9, C10, C12, C14, C16, C18, etc.) aryl group, or an unsubstituted or $R^{X3}$-substituted C3 to C18 (for example, C3, C4, C5, C6, C8, C10, C12, C14, C16, C18, etc.) heteroaryl group.

$R^{X3}$ is selected from any one of halogen, a cyano group or an isocyano group.

$n_1$ is an integer selected from 0 to 5 and for example, may be 0, 1, 2, 3, 4 or 5.

$n_2$ is an integer selected from 0 to 7 and for example, may be 0, 1, 2, 3, 4, 5, 6 or 7.

$n_3$ is an integer selected from 0 to 4 and for example, may be 0, 1, 2, 3 or 4.

$n_4$ is an integer selected from 0 to 3 and for example, may be 0, 1, 2 or 3.

$n_5$ is an integer selected from 0 to 6 and for example, may be 0, 1, 2, 3, 4, 5 or 6.

In an embodiment, $Ar_1$ and $Ar_2$ are each independently selected from any one of the following groups:

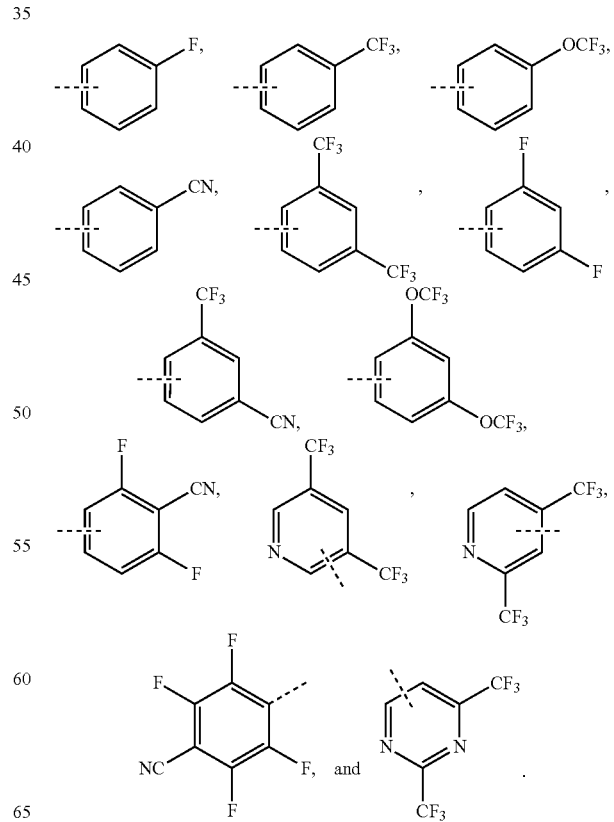

In the above groups, the dashed line represents a linkage site of the group.

In an embodiment, $X_1$ and $X_2$ are identical to each other, $L_1$ and $L_2$ are identical to each other, $R_1$ and $R_2$ are identical to each other, and $Ar_1$ and $Ar_2$ are identical to each other.

In an embodiment, the molecular weight of the organic compound is 450 g/mol to 1000 g/mol and for example, may be 480 g/mol, 500 g/mol, 520 g/mol, 550 g/mol, 580 g/mol, 600 g/mol, 620 g/mol, 650 g/mol, 680 g/mol, 700 g/mol, 720 g/mol, 750 g/mol, 780 g/mol, 800 g/mol, 820 g/mol, 850 g/mol, 880 g/mol, 900 g/mol, 920 g/mol, 950 g/mol, 980 g/mol or any specific numerical value between the above numerical values. For the sake of length and simplicity, the specific numerical values in the range will not be exhaustively listed in the present disclosure.

In a particular embodiment, the organic compound is selected from any one of the following compounds:

C1-1
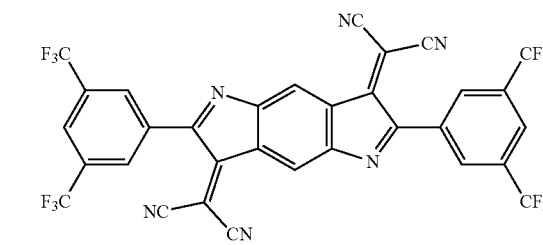

C1-2
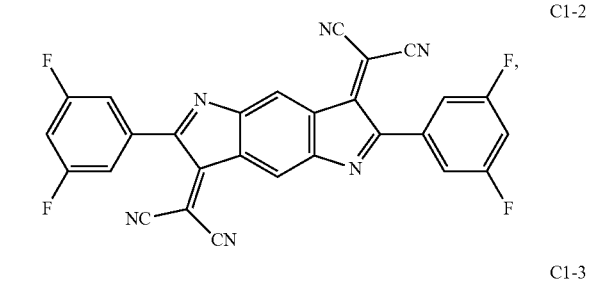

C1-3
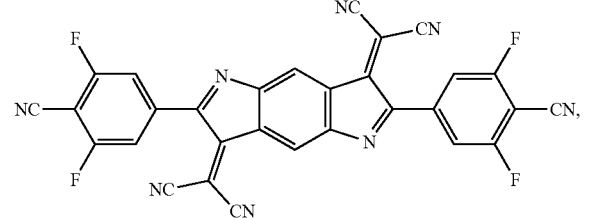

C1-4

C1-5
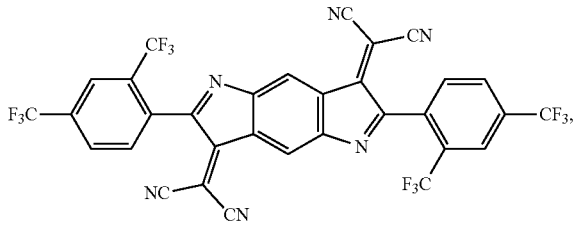

C1-6
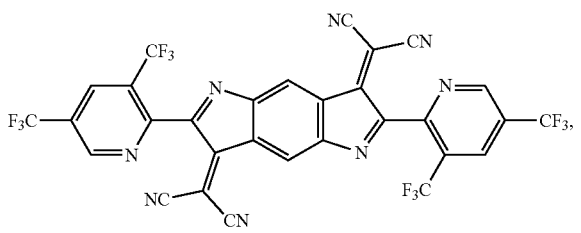

C1-7
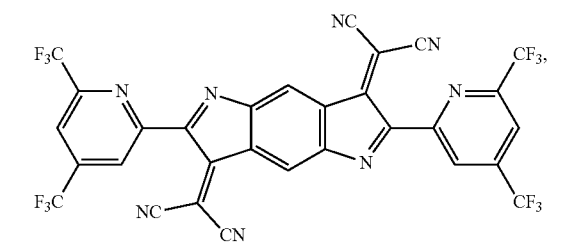

C1-8
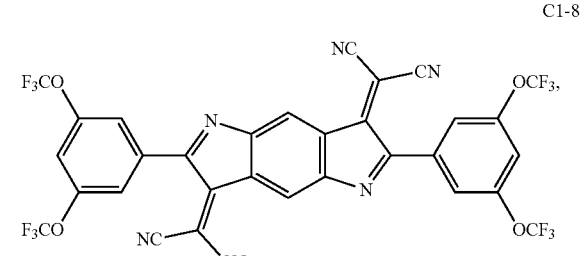

C1-9
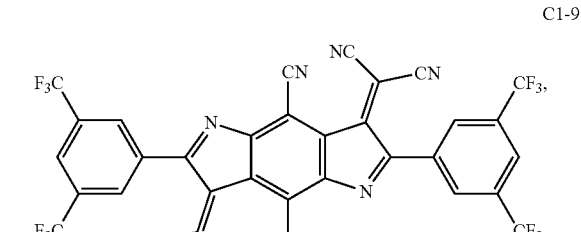

C1-10
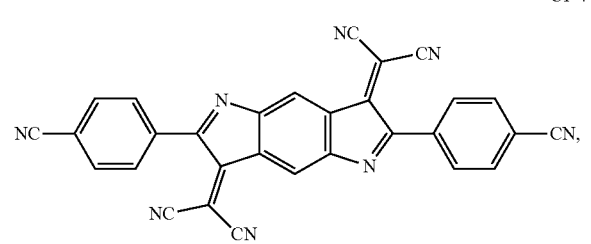

-continued
C1-11
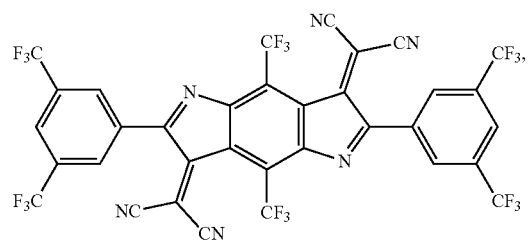
C1-17
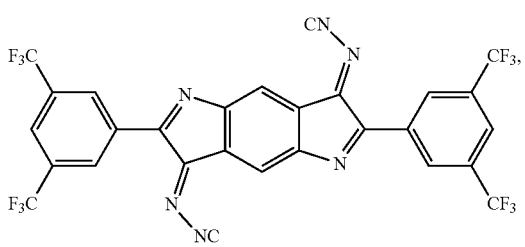
C1-12
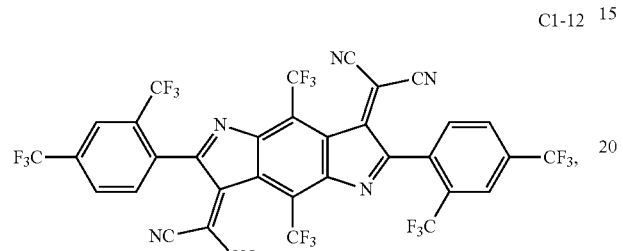
C1-18
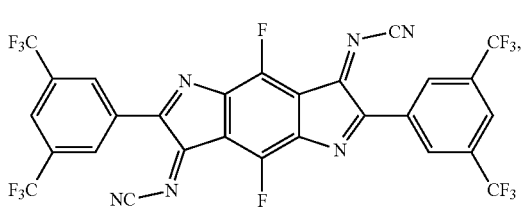
C1-13
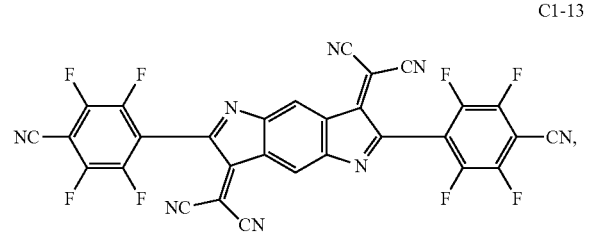
C1-19
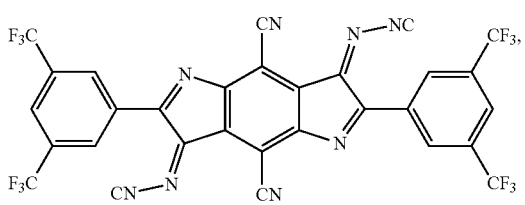
C1-14
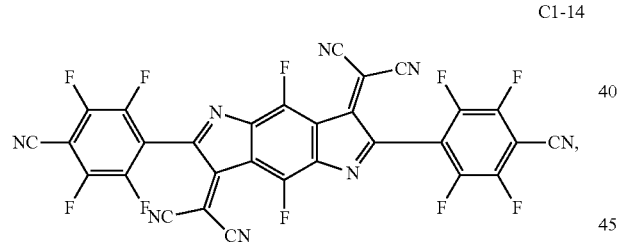
C1-20
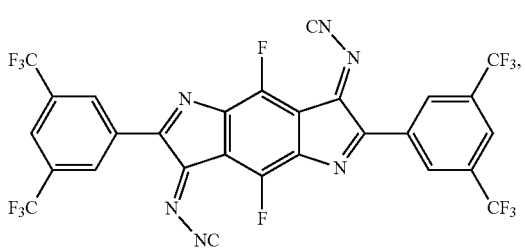
C1-15
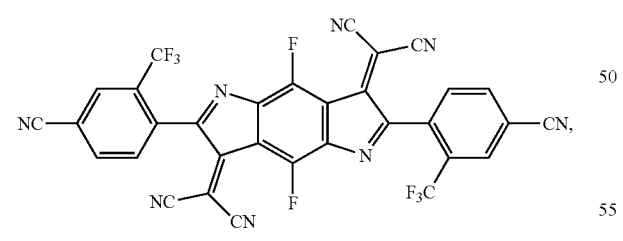
C1-21
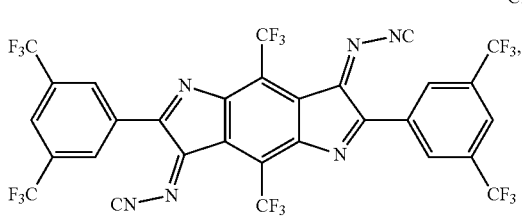
C1-16
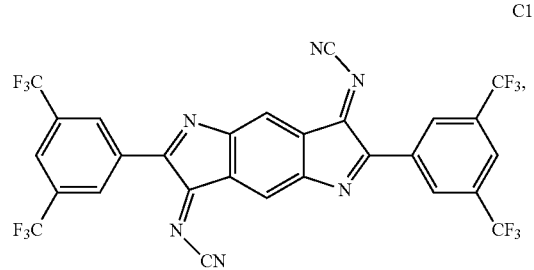
C1-22
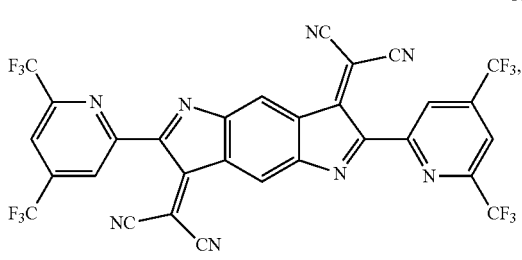

-continued
C1-23
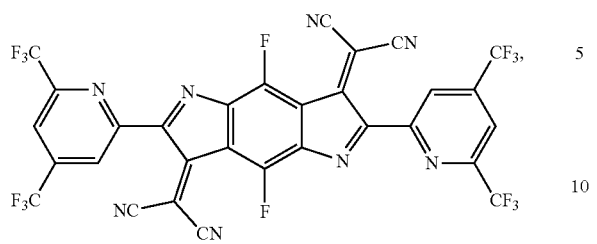
C1-24
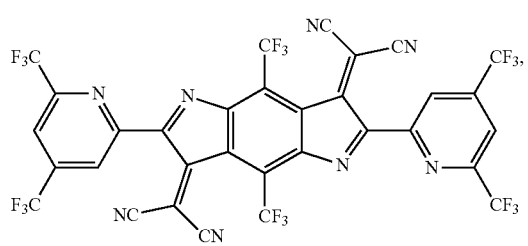
C1-25
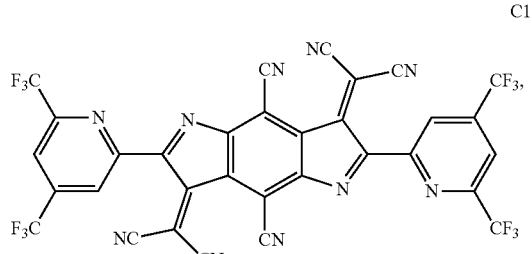
C1-26
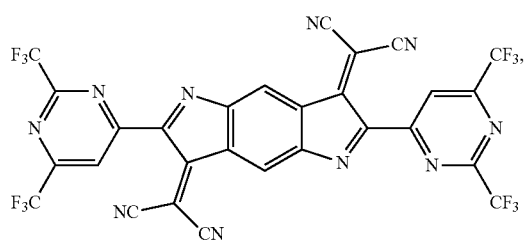
C1-27
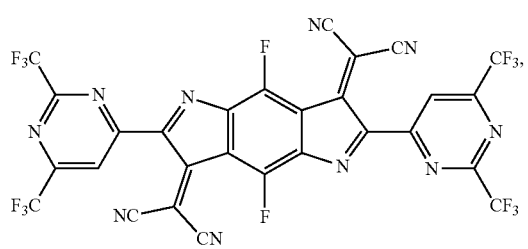
C1-28
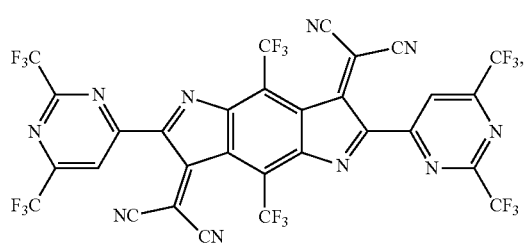
-continued
C1-16
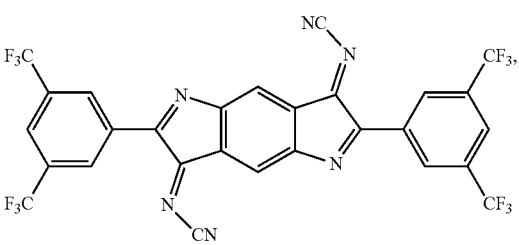
C1-16
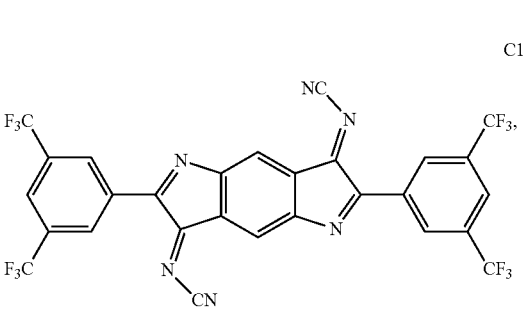
C1-29
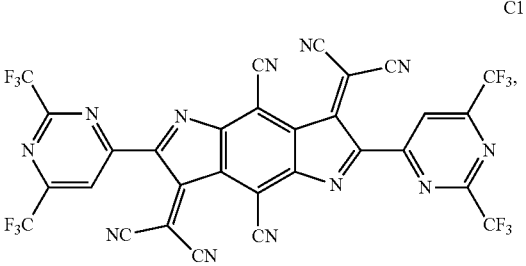
C1-30
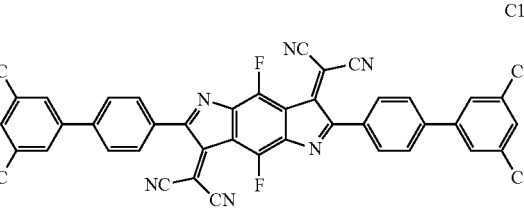
C1-31
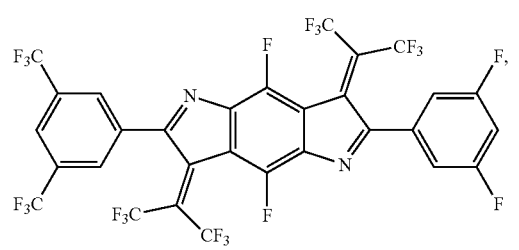
C1-32
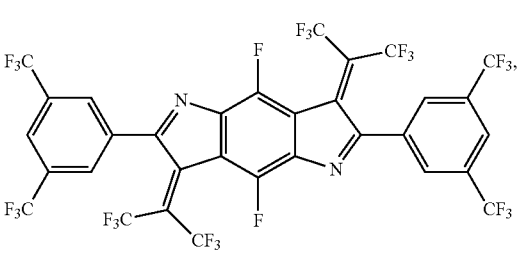

-continued
C1-33
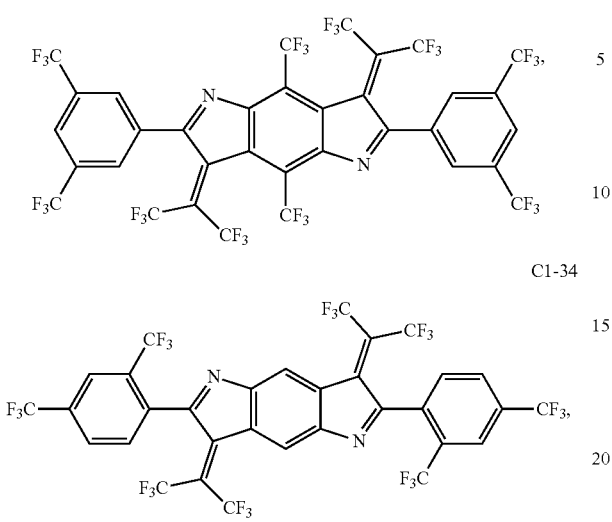
C1-34
C1-35
C1-36
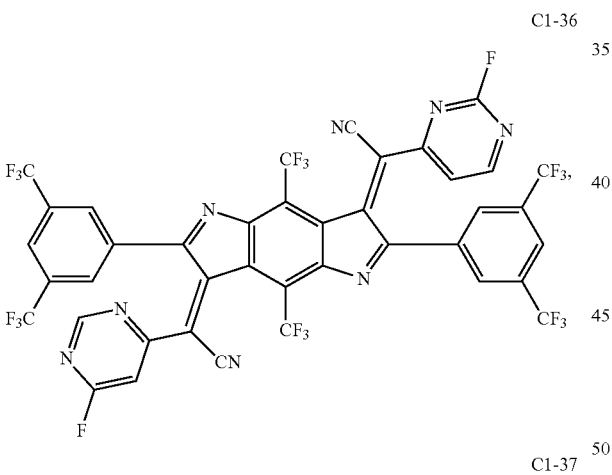
C1-37
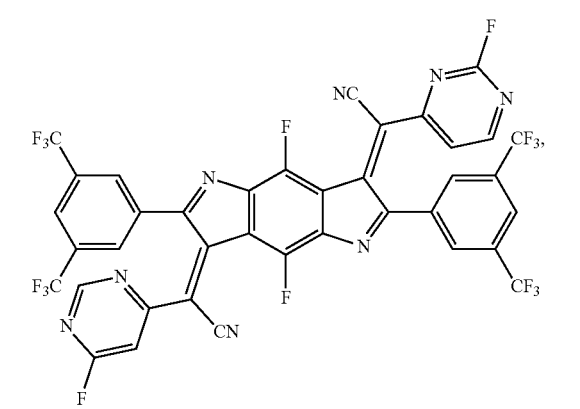
-continued
C1-38
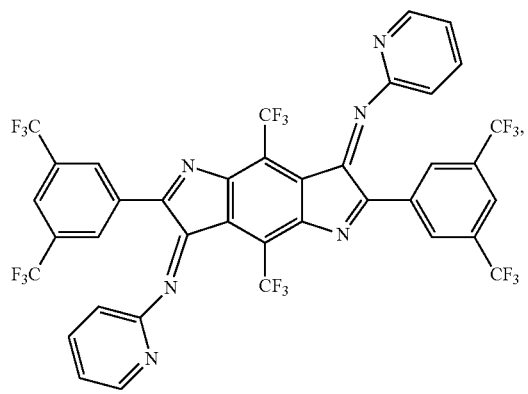
C1-39
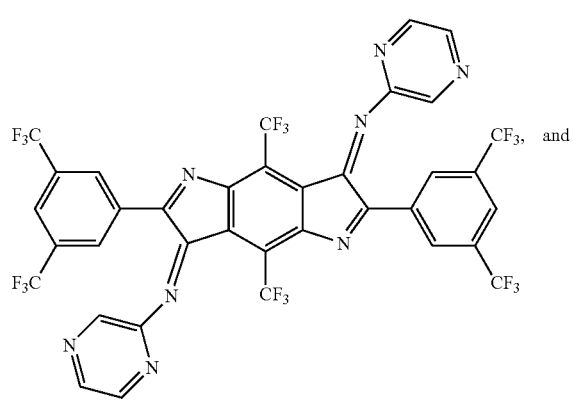
and
C1-40
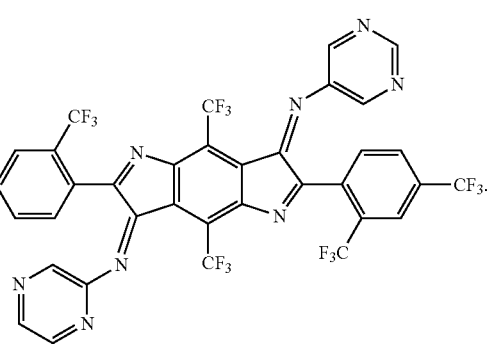
In a particular embodiment, the organic compound is selected from any one of the following compounds:
C2-1
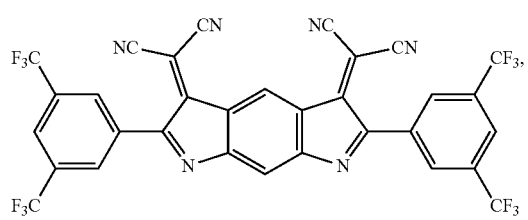

-continued
C2-2
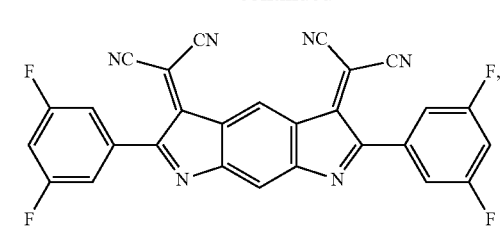
C2-3
C2-4
C2-5
C2-6
C2-7
C2-8
-continued
C2-9
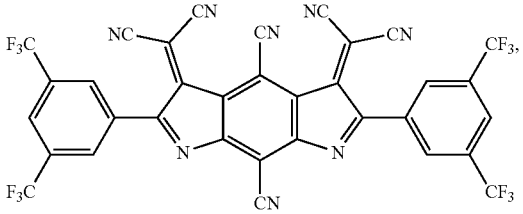
C2-10
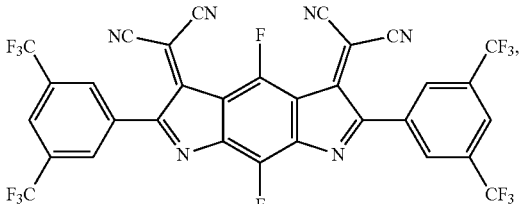
C2-11
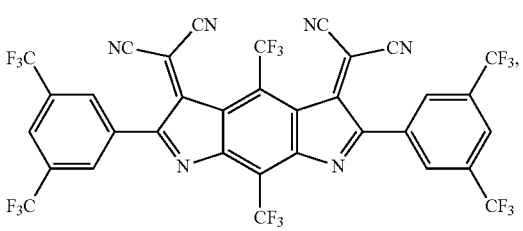
C2-12
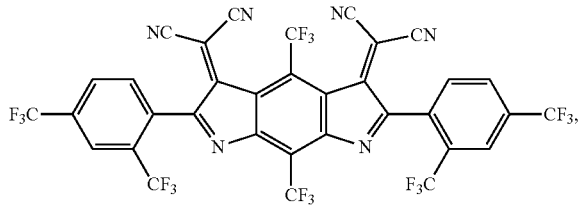
C2-13
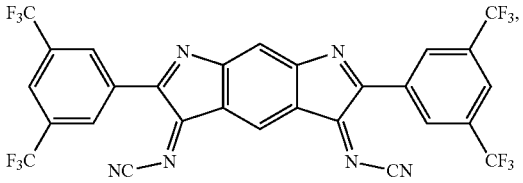
C2-14
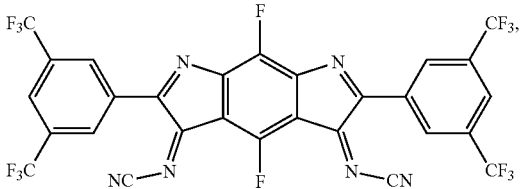
C2-15
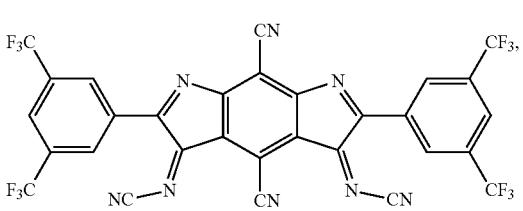

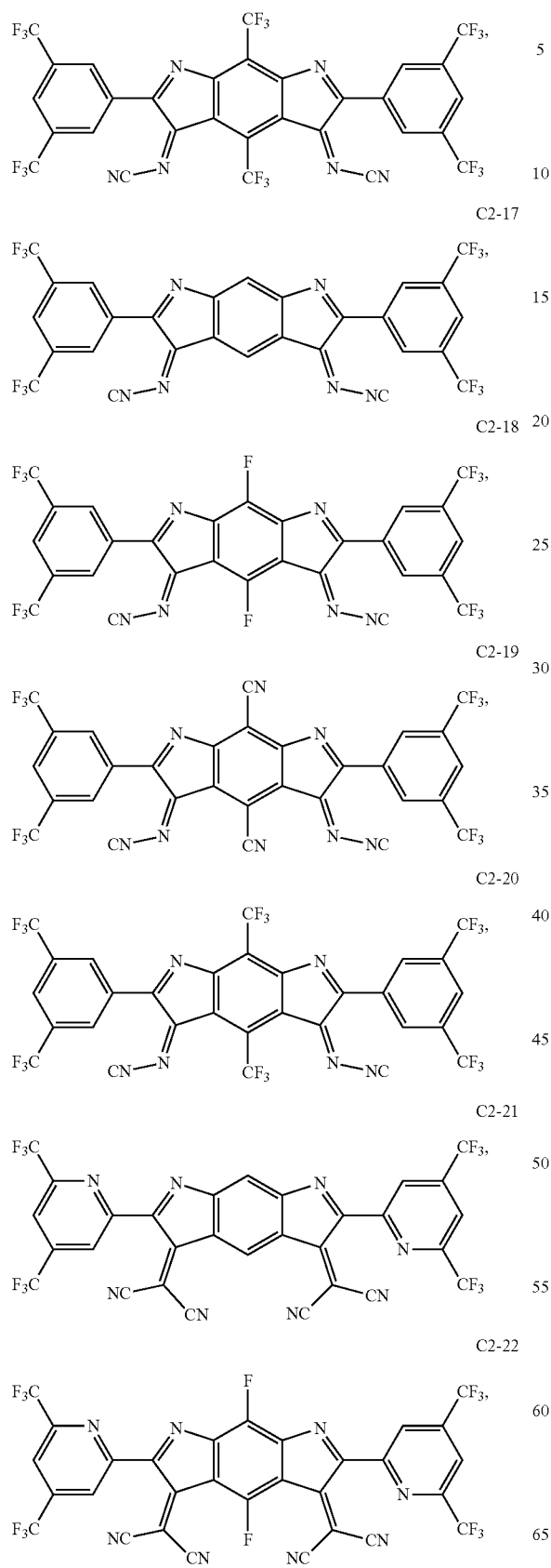
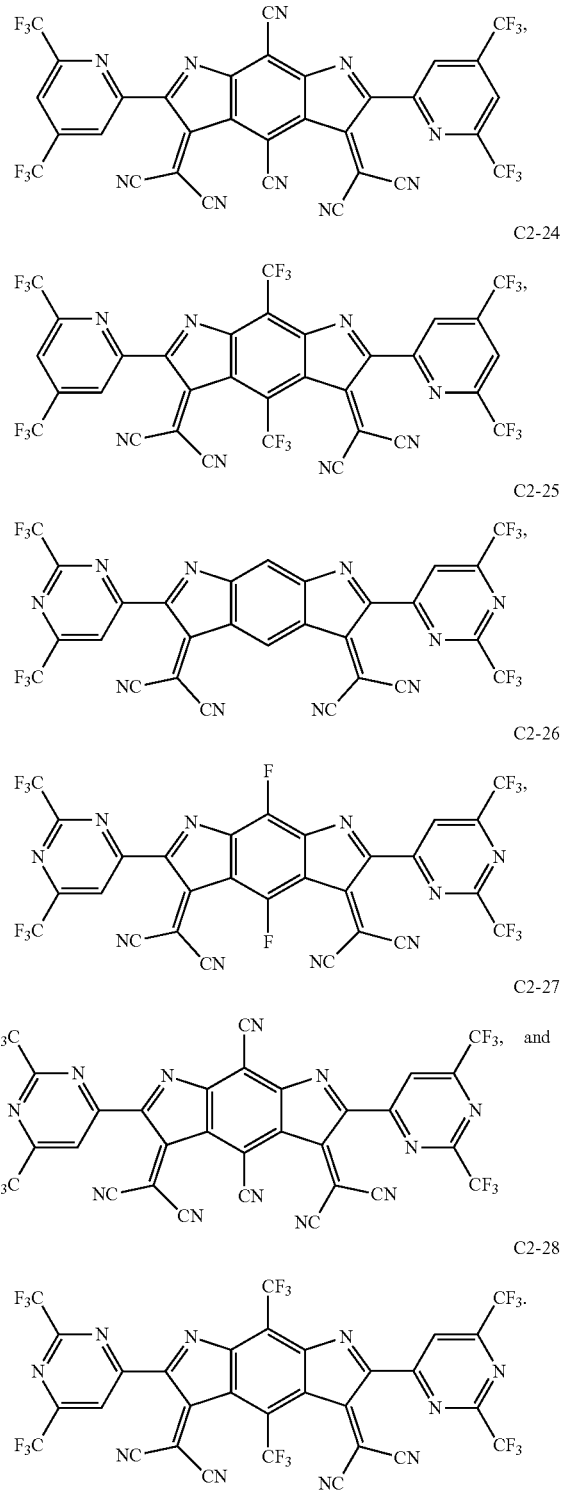
A second aspect of the present disclosure is to provide a hole injection material including the organic compound as described in the first aspect.
In an embodiment, the hole injection material includes a combination of a matrix material and a P-type dopant; where the P-type dopant includes the organic compound as described in the first aspect.

In an embodiment, the matrix material is an arylamine compound.

A third aspect of the present disclosure is to provide an OLED device. The OLED device includes an anode, a cathode and an organic thin film layer located between the anode and the cathode, and the material of the organic thin film layer includes the hole injection material as described in the second aspect.

In an embodiment, the organic thin film layer includes a light emitting layer, and a hole injection layer is arranged between the light emitting layer and the anode; the material of the hole injection layer includes the hole injection material as described in the second aspect.

In an embodiment, the organic thin film layer further includes any one or a combination of at least two of a hole transport layer, an electron transport layer or an electron injection layer.

In the OLED device provided by the present disclosure, the material of the anode is a conductive material with high work function and may be a metal, a metal oxide or a conductive polymer, where the metal includes copper, gold, silver, iron, chromium, nickel, manganese, palladium, platinum, and the like as well as alloys thereof, the metal oxide includes indium tin oxide (ITO), indium zinc oxide (IZO), zinc oxide, indium gallium zinc oxide (IGZO), and the like, and the conductive polymer includes polyaniline, polypyrrole, poly(3-methylthiophene) and the like. In addition to the above materials that facilitate the hole injection and combinations thereof, the material of the anode further includes known materials suitable to prepare the anode.

In the OLED device, the material of the cathode is a conductive material with a low work function and may be a metal or a multilayer metal material, wherein the metal includes sodium, calcium, aluminum, magnesium, silver, indium, tin, titanium and the like as well as their alloys, and the multilayer metal material includes LiF/Al, LiO$_2$/Al, BaF$_2$/Al, and the like. In addition to the above materials that facilitate the electron injection and combinations thereof, the material of the cathode further includes known materials suitable to prepare the cathode.

In the OLED device, the organic thin film layer includes at least one light emitting layer (EML) and any one or a combination of at least two of a hole transport layer (HTL), a hole injection layer (HIL), an electron blocking layer (EBL), a hole blocking layer (HBL), an electron transport layer (ETL) or an electron injection layer (EIL) disposed on two sides of the at least one light emitting layer, wherein the hole/electron injection and transport layers may be carbazole compounds, arylamine compounds, benzimidazole compounds, metal compounds, and the like.

As shown in the FIGURE which is a schematic diagram of the OLED device, the OLED device includes an anode 110, a cathode 150, and a light emitting layer 130 disposed between the anode 110 and the cathode 150. A first organic functional layer 120 and a second organic functional layer 140 are disposed on both sides of the light emitting layer 130. The first organic functional layer 120 includes a hole injection layer (HIL), optionally, a hole transport layer (HTL), and optionally an electron blocking layer (EBL). The second organic functional layer 140 includes any one or a combination of at least two of an electron transport layer (ETL), a hole blocking layer (HBL) or an electron injection layer (EIL).

After a voltage is applied to the OLED device, holes are injected from the anode 110 to the light emitting layer 130 through the first organic functional layer 120 (including a hole injection layer), and N-type charges are injected from the cathode 150 to the light emitting layer 130 through the second organic functional layer 140; where the light emitting layer 130 is an organic film layer having a combination of a luminescent body and a luminescent dye, and the hole injection layer includes at least one organic compound provided by the present disclosure.

In a particular embodiment, the hole injection layer is an organic film layer composed of the organic compound as a P-type dopant and an arylamine compound.

The OLED device may be prepared by the following method: forming an anode on a transparent or opaque smooth substrate, forming an organic thin layer on the anode, and forming a cathode on the organic thin layer. Wherein, the organic thin layer may be formed by using known film-forming methods such as evaporation, sputtering, spin coating, dipping, and ion plating.

A fourth aspect of the present disclosure is to provide a display panel including the OLED device as described in the third aspect.

Compared with the related art, the present disclosure has beneficial effects described below.

The organic compound provided by the present disclosure takes indolopyrrole as the nuclear structure. The organic compound has a deep LUMO energy level through the mutual synergy of the nuclear structure and a substituent group, and the LUMO energy level is close to the work function of the anode and the HOMO energy level of the hole transport layer, which can effectively promote the generation of holes. At the same time, the organic compound has a suitable molecular weight, low volatility, and high thermal stability, and can satisfy the vacuum evaporation requirements for the preparation of the OLED device. The organic compound is applied to the OLED device, especially suitable to be used as a P-type dopant for the hole injection layer, which can effectively control the charge balance in the device, significantly reduce the drive voltage of the device, prolong the working life, and enable the device to have high luminous performance.

In an embodiment, the organic compound has a structure as shown in Formula I in which $X_1$ and $X_2$ both are O, and is prepared according to the following synthesis route A1:

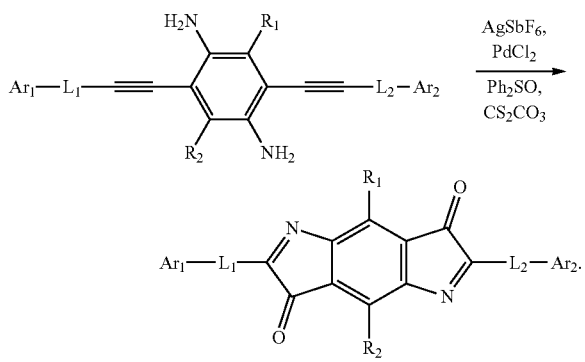

In the above synthesis route, $L_1$, $L_2$, $R_1$, $R_2$, $Ar_1$, and $Ar_2$ have the same ranges as defined in Formula I, and Ph$_2$SO represents diphenyl sulfoxide.

In an embodiment, the organic compound has a structure as shown in Formula I in which $X_1$ and $X_2$ both are CR"R"', and is prepared according to the following synthesis route A2:

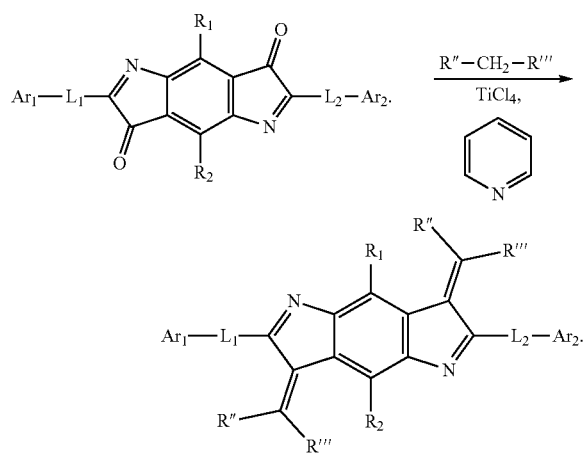

In the above synthesis route, R" and R'" have the same ranges as defined in the above description.

In an embodiment, the organic compound has a structure as shown in Formula I in which $X_1$ and $X_2$ both are NR', and is prepared according to the following synthesis route A3:

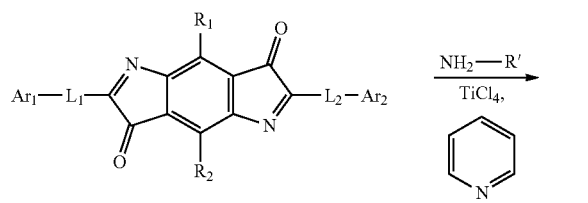

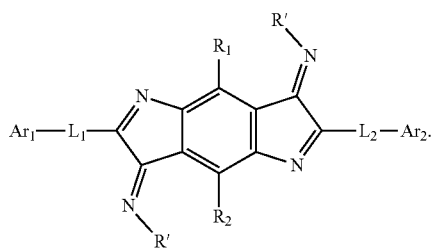

In the above synthesis route, R' has the same range as defined in the above description.

In an embodiment, the organic compound has a structure as shown in Formula II in which $X_1$ and $X_2$ both are O, and is prepared according to the following synthesis route B1:

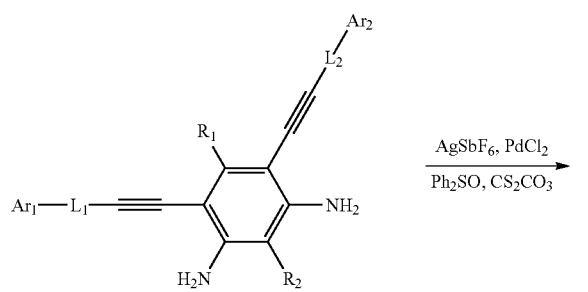

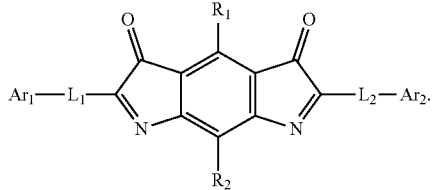

In the above synthesis route, $L_1$, $L_2$, $R_1$, $R_2$, $Ar_1$, and $Ar_2$ have the same ranges as defined in Formula II, and $Ph_2SO$ represents diphenyl sulfoxide.

In an embodiment, the organic compound has a structure as shown in Formula II in which $X_1$ and $X_2$ both are CR"R'", and is prepared according to the following synthesis route B2:

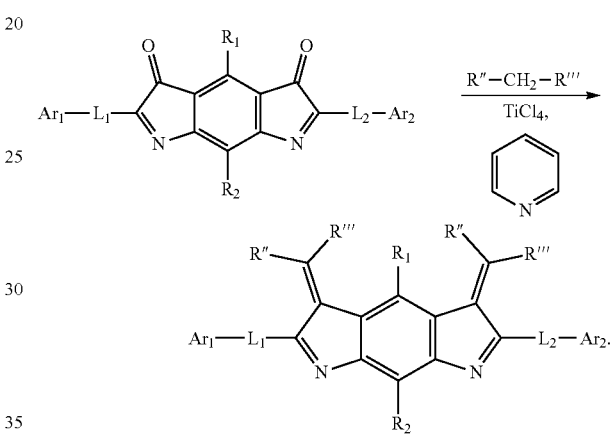

In the above synthesis route, R" and R'" have the same ranges as defined in the above description.

In an embodiment, the organic compound has a structure as shown in Formula II in which $X_1$ and $X_2$ both are NR', and is prepared according to the following synthesis route B3:

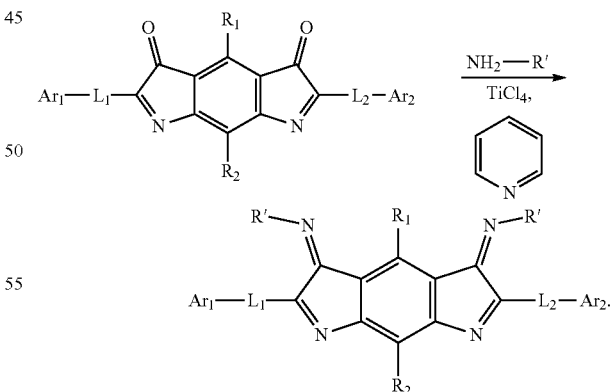

In the above synthesis route, R' has the same range as defined in the above description.

Examples of the organic compound of the present disclosure are illustratively listed below, and the mass spectrometry data of the compounds in the following examples are measured by waters SQ-Detector 2 mass spectrometer.

Example 1

An organic compound C1-1 is provided. The structure of the organic compound C1-1 is as follows:

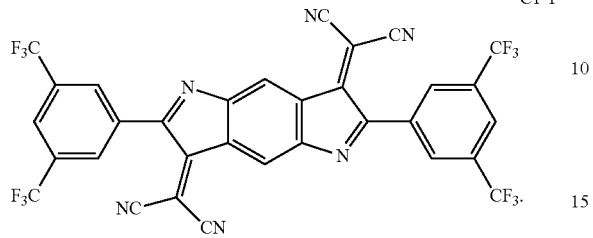

The preparation method of the organic compound C1-1 includes the steps described below.

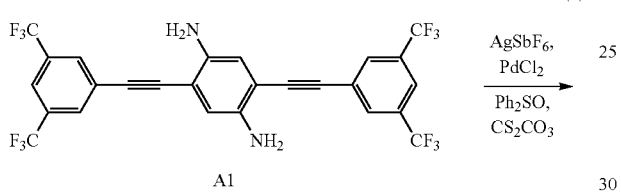

(1)

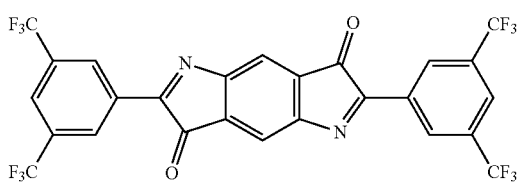

Compound A1 (5.8 g, 10 mmol), silver hexafluoroantimonate (AgSbF$_6$, 343 mg, 1 mmol), palladium chloride (PdCl$_2$, 177 mg, 1 mmol), and diphenyl sulfoxide (Ph$_2$SO, 4 g, 20 mmol) were dissolved in dichloroethane (DEM). The replacement of nitrogen was performed for protection. The mixture was heated to 60° C. and stirred for 12 hours. Then cesium carbonate (CS$_2$CO$_3$, 6.5 g, 20 mmol) was added to the reaction solution and stirred for 12 hours. After the reaction was complete, the reaction solution was extracted twice with dichloroethane. Then the dichloroethane was combined, washed twice with a hydrochloric acid aqueous solution, washed twice with ammonium chloride aqueous solution, and stratified. The organic solvent was then dried with anhydrous BaSO$_4$, concentrated to semi-dry, and separated by column chromatography (dichloromethane:petroleum ether=2:1, volume ratio) to give compound B1 (4 g, 65.7% yield).

Structural characterization of Compound B1: MS (EI) m/z: 608.04.

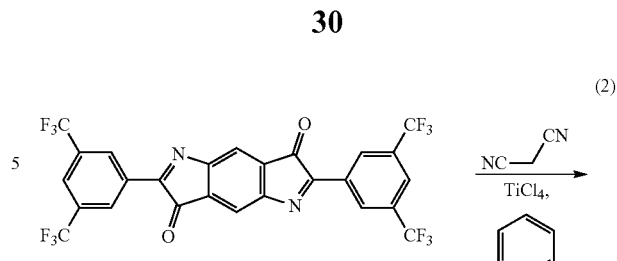

(2)

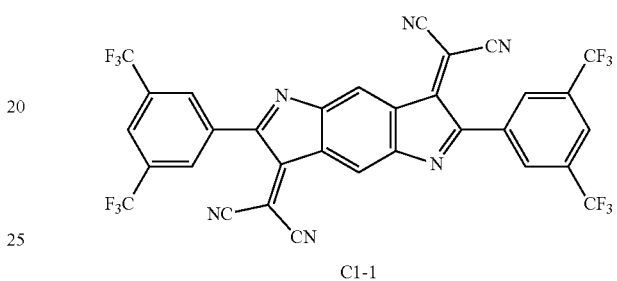

Compound B1 (3 g, 5 mmol) obtained in Step (1), malononitrile (2 mL), and dichloromethane (50 mL) were placed in a three-mouth flask. The replacement of nitrogen was performed for protection. The mixture was magnetic stirred. Titanium tetrachloride (TiCl$_4$, 3.8 g, 20 mmol) was slowly added, and pyridine (1 mL) was added. The obtained mixture was stirred at room temperature for 12 hours. After the reaction was completed, the solution was washed with water, washed with saturated ammonium chloride solution, dried with anhydrous barium sulfate, and concentrated to semi-dry. The separation was performed by column chromatography (dichloromethane:petroleum ether=2:1, volume ratio) to give compound C1-1 (2 g, 57.1% yield).

Structural characterization of Compound C1-1: MS (EI) m/z: 704.43.

Example 2

An organic compound C1-5 is provided. The structure of the organic compound C1-5 is as follows:

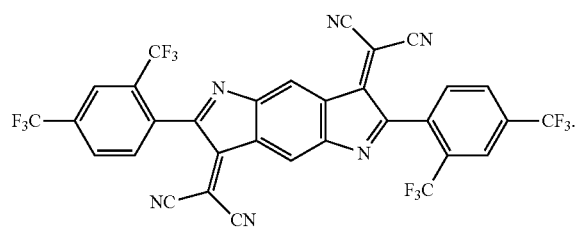

The preparation method of the organic compound C1-5 differs from the organic compound in Example 1 only in that Compound A1 in Step (1) was replaced by an equimolar amount of Compound A2

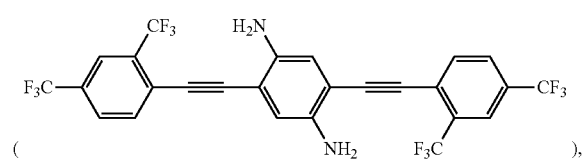

(A2)

while other raw materials and preparation methods are the same as those in Example 1.

Structural characterization of Compound C1-5: MS (EI) m/z: 704.43.

Example 3

An organic compound C1-7 is provided. The structure of the organic compound C1-7 is as follows:

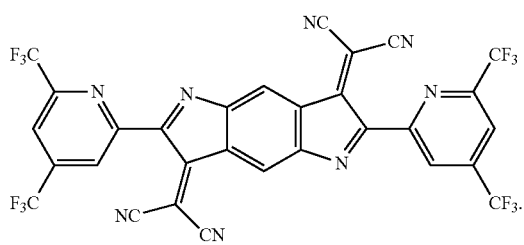

C1-7

The preparation method of the organic compound C1-7 differs from the organic compound in Example 1 only in that Compound A1 in Step (1) was replaced by an equimolar amount of Compound A3

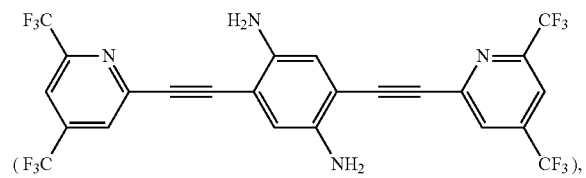

(A3)

while other raw materials and preparation methods are the same as those in Example 1.

Structural characterization of Compound C1-7: MS (EI) m/z: 706.40.

Example 4

An organic compound C1-18 is provided. The structure of the organic compound C1-18 is as follows:

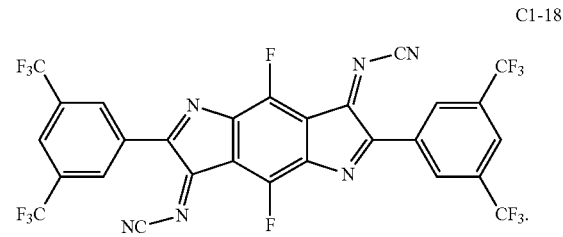 [SMILES: N#C/N=c1\c(-c2cc(C(F)(F)F)cc(C(F)(F)F)c2)nc2c(F)c3/c(=N/C#N)c(-c4cc(C(F)(F)F)cc(C(F)(F)F)c4)nc3c(F)c12]

C1-18

The preparation method of the organic compound C1-18 differs from the organic compound in Example 1 only in that Compound A1 in Step (1) was replaced by an equimolar amount of Compound A4

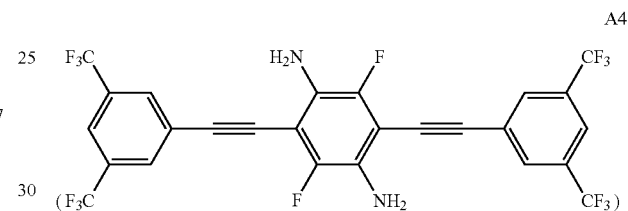

(A4)

and malononitrile in Step (2) was replaced by an equimolar amount of cyanamide ($NC-NH_2$), while other raw materials and preparation methods are the same as those in Example 1.

Structural characterization of Compound C1-18: MS (EI) m/z: 692.04.

Example 5

An organic compound C1-32 is provided. The structure of the organic compound C1-32 is as follows:

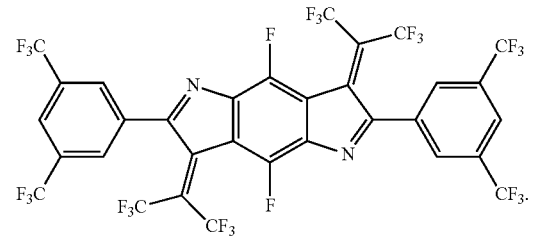

C1-32

The preparation method of the organic compound C1-32 differs from the organic compound in Example 4 only in that cyanamide in Step (2) was replaced by an equimolar amount of 1,1,1,3,3,3-hexafluoropropane

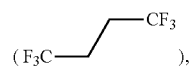

while other raw materials and preparation methods are the same as those in Example 4.

Structural characterization of Compound C1-32: MS (EI) m/z: 912.01.

Example 6

An organic compound C1-38 is provided. The structure of the organic compound C1-38 is as follows:

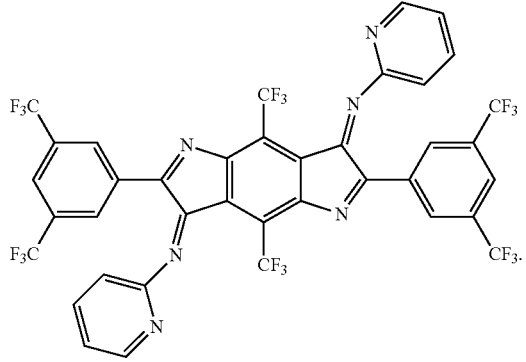

C1-38

The preparation method of the organic compound C1-38 differs from the organic compound in Example 1 only in that Compound A1 in Step (1) was replaced by an equimolar amount of Compound A6

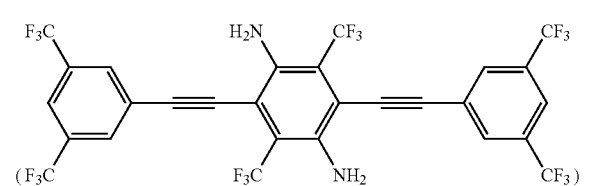

A6 and malononitrile in Step (2) was replaced by an equimolar amount of 2-aminopyridine, while other raw materials and preparation methods are the same as those in Example 1.

Structural characterization of Compound C1-38: MS (EI) m/z: 896.10.

Example 7

An organic compound C2-22 is provided. The structure of the organic compound C2-22 is as follows:

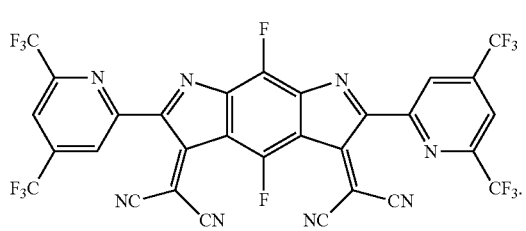

C2-22

The preparation method of the organic compound C2-22 differs from the compound in Example 1 only in that Compound A1 in Step (1) was replaced by an equimolar amount of Compound A7

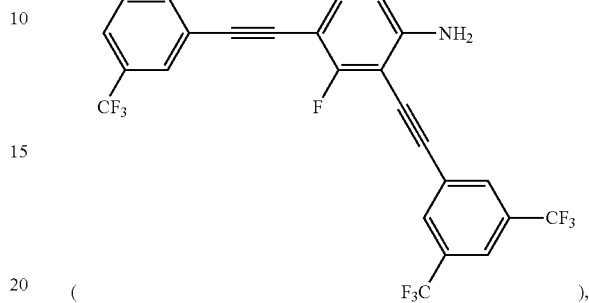

A7 while other raw materials and preparation methods are the same as those in Example 1.

Structural characterization of Compound C2-22: MS (EI) m/z: 742.38.

Calculation Results of the Compounds:

With density functional theory (DFT), the distribution and energy levels of molecular frontier orbital HOMO and LUMO were optimized and calculated for the organic compounds provided by the present disclosure by using a Guassian 09 package (Guassian Inc.) at a calculation level of B3LYP/6-31G(d). Results are shown in Table 1.

TABLE 1

| Organic compound | HOMO (eV) | LUMO (eV) | $E_g$ (eV) |
|---|---|---|---|
| C1-1 | −7.1 | −4.91 | 2.19 |
| C1-4 | −6.97 | −4.89 | 2.08 |
| C1-5 | −7.03 | −4.9 | 2.12 |
| C1-7 | −7.12 | −4.81 | 2.32 |
| C1-13 | −7.54 | −5.19 | 2.35 |
| C1-14 | −7.64 | −5.34 | 2.30 |
| C1-15 | −7.51 | −5.09 | 2.42 |
| C1-18 | −7.32 | −5.11 | 2.21 |
| C1-32 | −6.98 | −4.97 | 2.01 |
| C1-38 | −7.70 | −5.40 | 2.30 |
| C2-22 | −7.47 | −5.10 | 2.37 |
| C2-28 | −6.94 | −4.90 | 2.04 |

As can be seen from data in Table 1, through the design of the molecular structure, the organic compound provided by the present disclosure has a deep HOMO energy level and a deep LUMO energy level, can be matched with HTL with different HOMO energy levels at the LUMO energy level from −4.8 eV to −5.4 eV, and thus has a very wide application range.

Application examples in which the organic compounds provided by the present disclosure are applied to the OLED device are illustratively listed below.

Application Example 1

An OLED device is provided. The OLED device sequentially includes a glass substrate having an ITO anode, a hole injection layer, a hole transport layer, a light emitting layer, an electron transport layer, and a cathode (aluminum electrode).

The OLED device is prepared by the steps described below.
(1) A glass substrate with an ITO anode was cleaned and then installed onto a vacuum deposition device, and the organic film layers were thermally deposited in turn.
(2) Hole injection layer: Compound HT (matrix material) and the organic compound C1-1 (P-type dopant) provided in Example 1 of the present disclosure were co-deposited on the ITO anode layer to form a hole injection layer with a thickness of 10 nm, in which the mass ratio of Compound HT to Compound C1-1 was 97:3.
(3) Hole transport layer: Compound HT was deposited by vacuum evaporation on the hole injection layer to form a hole transport layer with a thickness of 120 nm.
(4) Light emitting layer: Compound H1 and Compound D1 were co-deposited on the hole transport layer to form a light emitting layer with a thickness of 20 nm, in which the mass ratio of Compound H1 to Compound D1 was 98:2.
(5) Electron transport layer: Compound ET and Liq were co-deposited on the light emitting layer to form an electron transport layer with a thickness of 30 nm, in which the mass ratio of Compound ET to Liq was 50:50.
(6) Cathode: Aluminum with a thickness of 120 nm was deposited by vacuum evaporation on the electron transport layer as the cathode to obtain the OLED device.

The structures of compounds used in the OLED device are as follows:

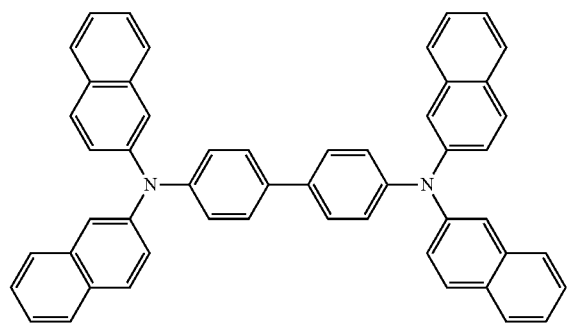

Compound HT

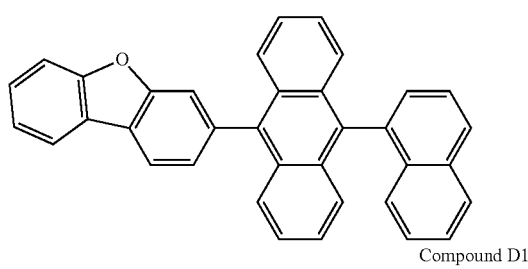

Compound H1

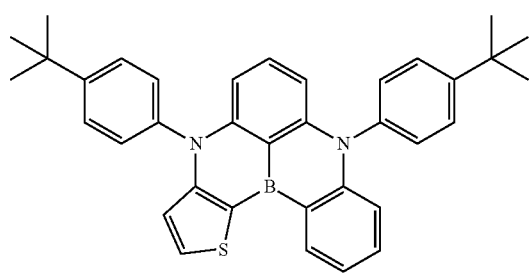

Compound D1

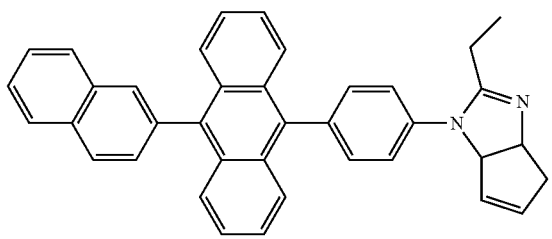

Compound ET

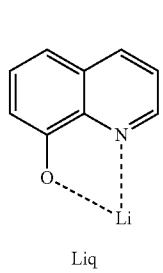

Liq

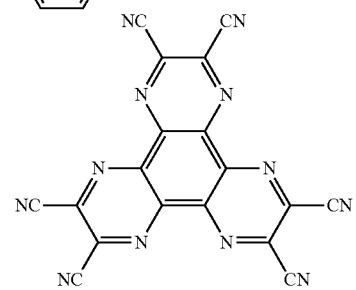

HATCN

Application Example 2

The application example differs from Application Example 1 in that the organic compound C1-1 in Step (1) was replaced by an equal amount of organic compound C1-5, while other materials and preparation steps are the same.

Application Example 3

The application example differs from Application Example 1 in that the organic compound C1-1 in Step (1) was replaced by an equal amount of organic compound C1-7, while other materials and preparation steps are the same.

Application Example 4

The application example differs from Application Example 1 in that the organic compound C1-1 in Step (1) was replaced by an equal amount of organic compound C1-18, while other materials and preparation steps are the same.

Application Example 5

The application example differs from Application Example 1 in that the organic compound C1-1 in Step (1) was replaced by an equal amount of organic compound C1-32, while other materials and preparation steps are the same.

Application Example 6

The application example differs from Application Example 1 in that the organic compound C1-1 in Step (1) was replaced by an equal amount of organic compound C1-38, while other materials and preparation steps are the same.

Application Example 7

The application example differs from Application Example 1 in that the organic compound C1-1 in Step (1)

was replaced by an equal amount of organic compound C2-22, while other materials and preparation steps are the same.

Application Example 8

The application example differs from Application Example 1 in that the organic compound C1-1 in Step (1) was replaced by an equal amount of organic compound C1-28, while other materials and preparation steps are the same.

Comparative Example 1

The comparative example differs from Application Example 1 in that the organic compound C1-1 in Step (1) was replaced by an equal amount of Compound HATCN, while other materials and preparation steps are the same.
Performance Evaluation of the OLED Device:

The above OLED devices are characterized by the standard method, and the current efficiency (cd/A), drive voltage (V), and lifetime (%) were measured by calibrated Keithley 2400 and CS2000, and the CIE 1931y chromaticity coordinates were calculated. Wherein, the drive voltage, current efficiency, and lifetime are all measured values at the current density J=10 mA/cm$^2$, and the lifetime is defined as the time required for brightness attenuation to 95% of the initial value. Specific data are shown in Table 2.

TABLE 2

| OLED Device | P-type dopant of the hole injection layer | Drive voltage (V) | CIE-y | Current efficiency (cd/A) | Lifetime LT95 (h) |
|---|---|---|---|---|---|
| Application example 1 | C1-1 | 3.83 | 0.050 | 4.5 | 1200 |
| Application example 2 | C1-5 | 3.58 | 0.048 | 4.2 | 1400 |
| Application example 3 | C1-7 | 3.65 | 0.046 | 4.9 | 1380 |
| Application example 4 | C1-18 | 4.02 | 0.051 | 3.7 | 1070 |
| Application example 5 | C1-32 | 4.23 | 0.045 | 3.9 | 980 |
| Application example 6 | C1-38 | 4.34 | 0.048 | 4.0 | 960 |
| Application example 7 | C2-22 | 4.12 | 0.046 | 3.9 | 750 |
| Application example 8 | C2-28 | 4.32 | 0.054 | 3.8 | 840 |
| Comparative example 1 | HATCN | 4.65 | 0.046 | 3.5 | 500 |

As can be seen from the test data in Table 2, compared with Compound HATCN, a representative material in the art, the OLED device prepared by using the organic compound provided by the present disclosure as a P-type dopant has lower drive voltage and longer lifetime and is also improved in terms of the luminous efficiency.

The above results show that when the organic compound having the structure shown in Formula I or Formula II provided by the present disclosure is used as a hole P-type dopant, the light-emitting device prepared by the organic compound has better performance than the light-emitting device prepared by HATCN in the related art, and especially in terms of reducing voltage and improving lifetime, the organic compound makes remarkable progress.

The applicant has stated that although the organic compound, the hole injection material, and the application thereof in the present disclosure are described through the embodiments described above, the present disclosure is not limited to the processes and steps described above, which means that the implementation of the present disclosure does not necessarily depend on the processes and steps described above. It should be apparent to those skilled in the art that any improvements made to the present disclosure, equivalent replacements of raw materials selected in the present disclosure and addition of adjuvant ingredients thereof, selections of specific methods, etc., all fall within the protection scope and the disclosed scope of the present disclosure.

What is claimed is:
1. An organic compound, having a structure as shown in Formula I or Formula II:

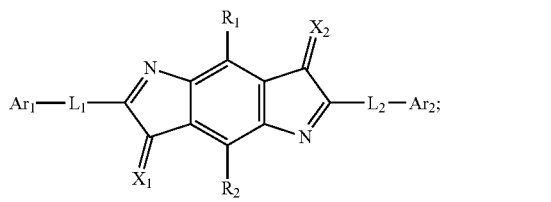

Formula I

Formula II wherein $X_1$ and $X_2$ are each independently selected from NR' or CR"R'";
wherein R', R", and R'" are electron withdrawing groups and each independently selected from any one of halogen, a cyano group, an isocyano group, a $R^{X1}$-substituted C1 to C20 linear or branched alkyl group, a $R^{X1}$-substituted C1 to C20 alkoxyl group, a $R^{X2}$-substituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, or a substituted or unsubstituted C6 to C30 arylphosphonoxy group;
wherein $R^{X1}$ is selected from fluorine, a cyano group or an isocyano group;
wherein $R^{X2}$ is selected from any one of fluorine, a cyano group, an isocyano group, a fluorine-substituted C1 to C20 alkoxyl, or a fluorine-substituted C1 to C20 linear or branched alkyl group;
wherein $L_1$ and $L_2$ are each independently selected from any one of a single bond, a substituted or unsubstituted C6 to C30 arylene group, or a substituted or unsubstituted C3 to C30 heteroarylene group;
wherein $R_1$ and $R_2$ are each independently selected from any one of halogen, a cyano group, a substituted or unsubstituted C1 to C20 linear or branched alkyl group, a substituted or unsubstituted C3 to C20 cycloalkyl group, a substituted or unsubstituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, a substituted or unsubstituted C6 to C30 arylphosphonoxy group, a substituted or unsubstituted C3 to C20 alkylsilyl group, or a substituted or unsubstituted C6 to C30 arylsilyl group; and wherein $Ar_1$ and $Ar_2$ are each independently selected from any one of the following groups:

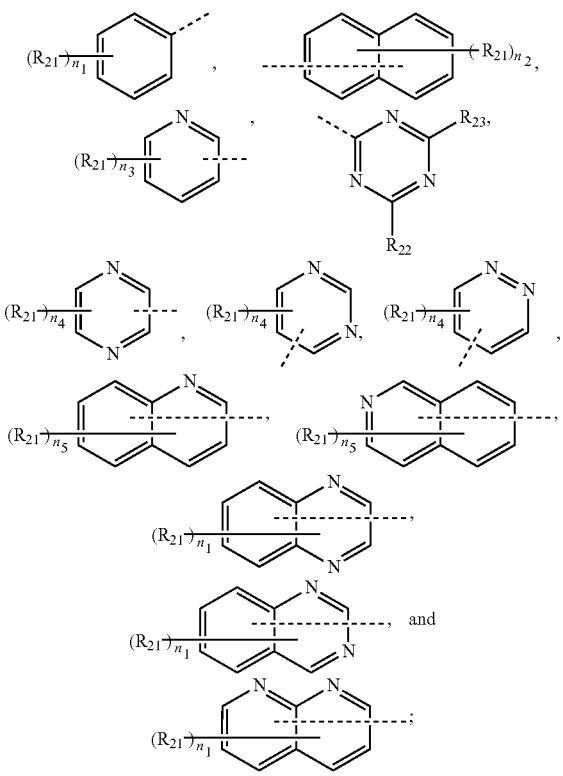

wherein the dashed line represents a linkage site of a group;

wherein $R_{21}$ is selected from any one of halogen, a cyano group, an isocyano group, an unsubstituted or $R^{X3}$-substituted C1 to C10 linear or branched alkyl group, an unsubstituted or $R^{X3}$-substituted C1 to C10 alkoxyl group, an unsubstituted or $R^{X3}$-substituted C1 to C10 alkylthio group, an unsubstituted or $R^{X3}$-substituted C6 to C18 aryl group, or an unsubstituted or $R^{X3}$-substituted C3 to C18 heteroaryl group;

wherein $R_{22}$ and $R_{23}$ are each independently selected from any one of hydrogen, deuterium, halogen, a cyano group, an isocyano group, an unsubstituted or $R^{X3}$-substituted C1 to C10 linear or branched alkyl group, an unsubstituted or $R^{X3}$-substituted C1 to C10 alkoxyl group, an unsubstituted or $R^{X3}$-substituted C1 to C10 alkylthio group, an unsubstituted or $R^{X3}$-substituted C6 to C18 aryl group, or an unsubstituted or $R^{X3}$-substituted C3 to C18 heteroaryl group;

wherein $R^{X3}$ is selected from any one of halogen, a cyano group or an isocyano group;

wherein $n_1$ is an integer selected from 1 to 5;
wherein $n_2$ is an integer selected from 0 to 7;
wherein $n_3$ is an integer selected from 0 to 4;
wherein $n_4$ is an integer selected from 0 to 3; and
wherein $n_5$ is an integer selected from 0 to 6.

2. The organic compound according to claim 1, wherein the substituents of the substituted heteroaryl, the substituted aryl keto group, the substituted heteroaryl keto group, the substituted arylsulfone group, and the substituted arylphosphonoxy group in R', R", and R''' are each independently selected from at least one of deuterium, halogen, a cyano group, an isocyano group, an unsubstituted or $R^{X3}$-substituted C1 to C10 linear or branched alkyl group, an unsubstituted or $R^3$-substituted C1 to C10 alkoxyl, an unsubstituted or $R^{X3}$-substituted C1 to C10 alkylthio group, an unsubstituted or $R^{X3}$-substituted C6 to C18 aryl group, or an unsubstituted or $R^{X3}$-substituted C3 to C18 heteroaryl group;

wherein the substituted substituent groups in $L_1$, $L_2$, $R_1$, $R_2$, $Ar_1$, $Ar_2$ are each independently selected from any one of deuterium, halogen, a cyano group, an isocyano group, an unsubstituted or $R^{X3}$-substituted C1 to C10 linear or branched alkyl group, an unsubstituted or $R^{X3}$-substituted C1 to C10 alkoxyl group, an unsubstituted or $R^{X3}$-substituted C1 to C10 alkylthio group, an unsubstituted or $R^3$-substituted C6 to C18 aryl group, an unsubstituted or $R^{X3}$-substituted C3 to C18 heteroaryl group, or a C6 to C18 arylamine group; and wherein $R^{X3}$ is selected from any one of a halogen-containing group, a cyano group or an isocyano group.

3. The organic compound according to claim 1, wherein R', R", and R''' are each independently selected from any one of fluorine, a cyano group, an isocyano group, a fluorine-substituted C1 to C6 alkoxyl group, or a fluorine-substituted C1 to C6 linear or branched alkyl group.

4. The organic compound according to claim 1, wherein R', R", and R''' are each independently selected from any one of the following groups:

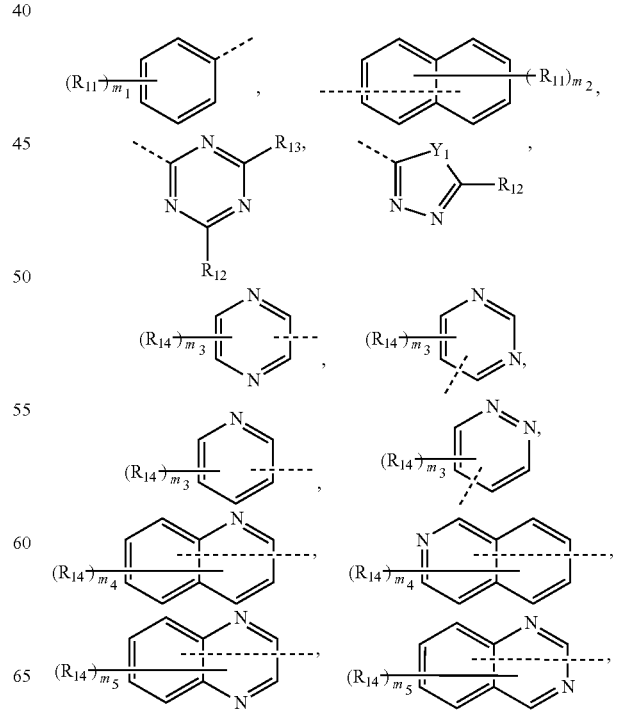

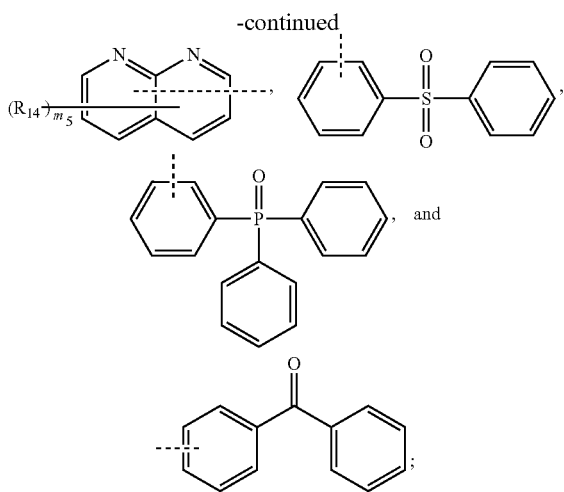

wherein the dashed line represents a linkage site of a group;

wherein $Y_1$ is selected from O, S or $NR_N$;

wherein $R_{11}$ is selected from any one of fluorine, a cyano group, an isocyano group, a fluorine-substituted C1 to C6 alkoxyl group, or a fluorine-substituted C1 to C6 linear or branched alkyl group;

wherein $R_{12}$, $R_{13}$, and $R_N$ are each independently selected from any one of hydrogen, deuterium, halogen, a cyano group, an isocyano group, an unsubstituted or $R^{X3}$-substituted C1 to C10 linear or branched alkyl group, an unsubstituted or $R^3$-substituted C1 to C10 alkoxyl group, an unsubstituted or $R^{X3}$-substituted C1 to C10 alkylthio group, an unsubstituted or $R^{X3}$-substituted C6 to C18 aryl group, or an unsubstituted or $R^{X3}$-substituted C3 to C18 heteroaryl group;

wherein $R_{14}$ is selected from any one of deuterium, halogen, a cyano group, an isocyano group, an unsubstituted or $R^{X3}$-substituted C1 to C10 linear or branched alkyl group, an unsubstituted or $R^{X3}$-substituted C1 to C10 alkoxyl group, an unsubstituted or $R^{X3}$-substituted C1 to C10 alkylthio group, an unsubstituted or $R^{X3}$-substituted C6 to C18 aryl group, or an unsubstituted or $R^3$-substituted C3 to C18 heteroaryl group;

wherein $R^{X3}$ is selected from any one of halogen, a cyano group or an isocyano group;

wherein $m_1$ is an integer selected from 1 to 5;
wherein $m_2$ is an integer selected from 1 to 7;
wherein $m_3$ is an integer selected from 0 to 3;
wherein $m_4$ is an integer selected from 0 to 6; and
wherein $m_5$ is an integer selected from 0 to 5.

5. The organic compound according to claim 1, wherein $X_1$ and $X_2$ are

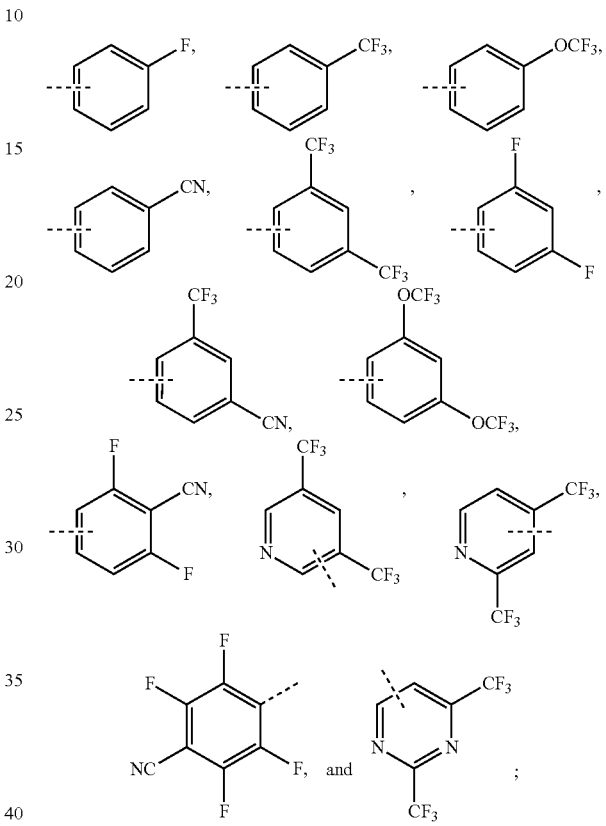

wherein * represents a linkage site of a group.

6. The organic compound according to claim 1, wherein $L_1$ and $L_2$ are each independently selected from any one of a single bond, a phenylene group, a biphenylene group or a naphthylene group.

7. The organic compound according to claim 1, wherein $R_1$ and $R_2$ are each independently selected from any one of halogen, cyano group, fluorine-substituted C1 to C6 alkoxyl group or fluorine-substituted C1 to C6 linear or branched alkyl group.

8. The organic compound according to claim 7, wherein $Ar_1$ and $Ar_2$ are each independently selected from any one of the following groups:

wherein the dashed line represents a linkage site of a group.

9. The organic compound according to claim 1, wherein $X_1$ and $X_2$ are identical to each other, $L_1$ and $L_2$ are identical to each other, $R_1$ and $R_2$ are identical to each other, and $Ar_1$ and $Ar_2$ are identical to each other.

10. The organic compound according to claim 1, wherein the molecular weight of the organic compound is 450 g/mol to 1000 g/mol.

11. The organic compound according to claim 1, wherein the organic compound is selected from any one of the following compounds:

C1-9

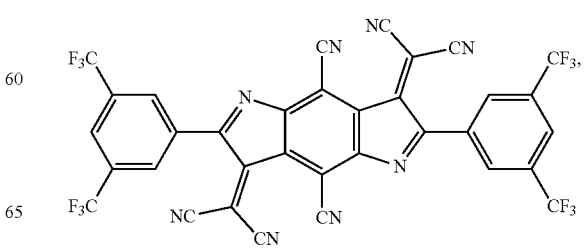

C1-10
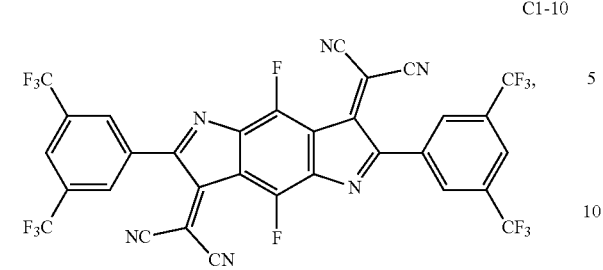
C1-11
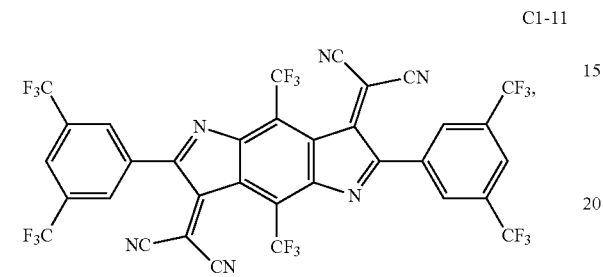
C1-12
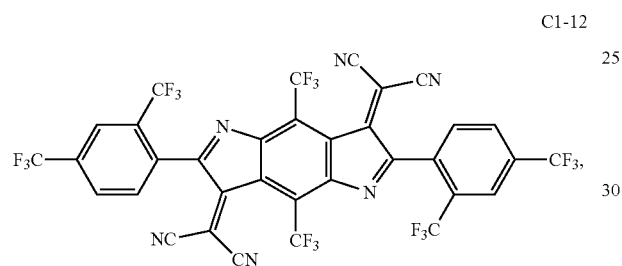
C1-14
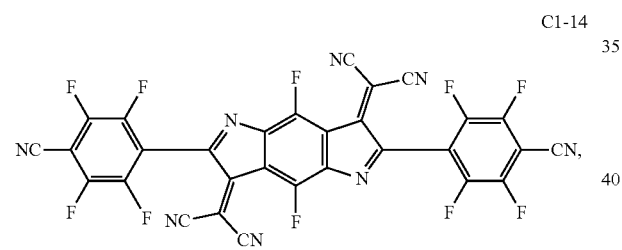
C1-15
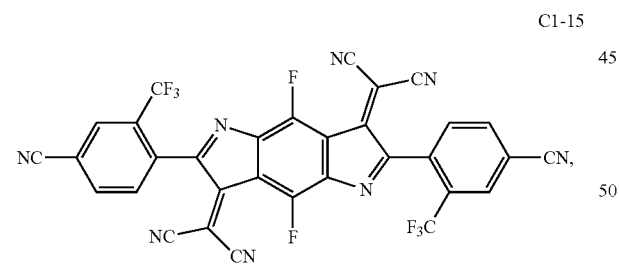
C1-18
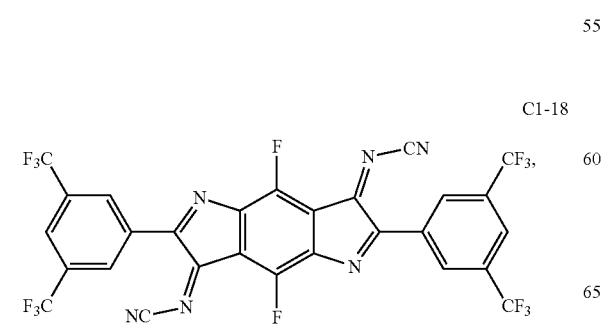
C1-19
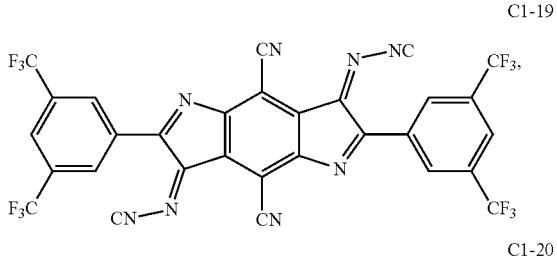
C1-20
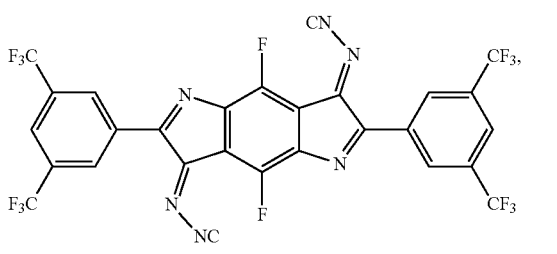
C1-21
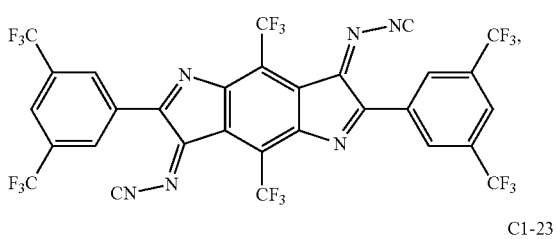
C1-23
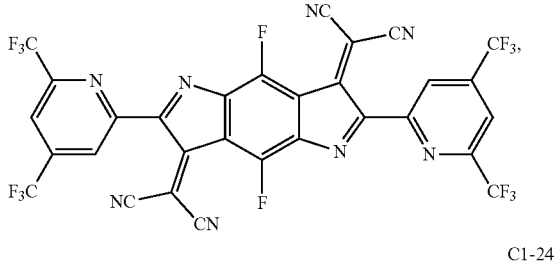
C1-24
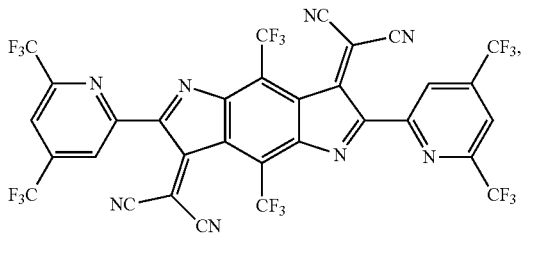
C1-25
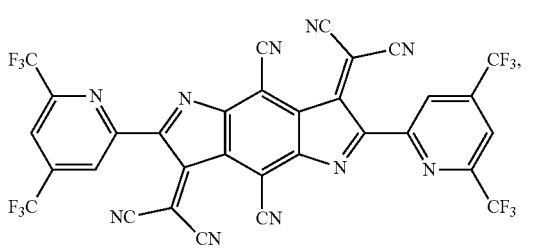

C1-27
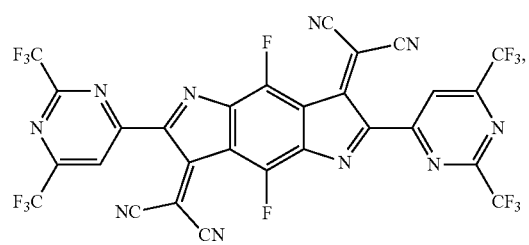
C1-28
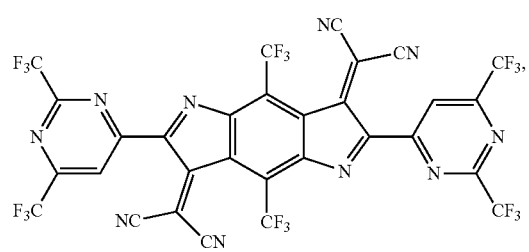
C1-29
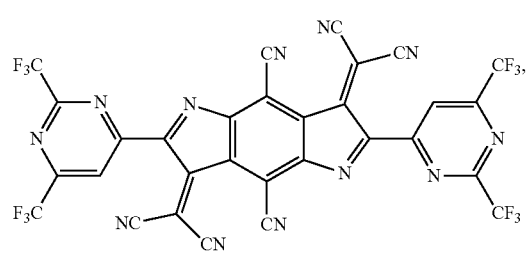
C1-30
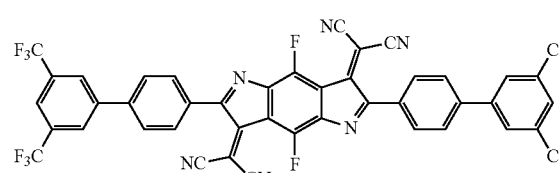
C1-31
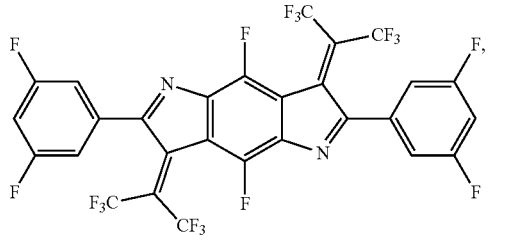
C1-32
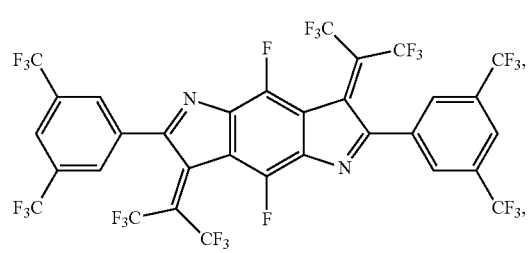
C1-33
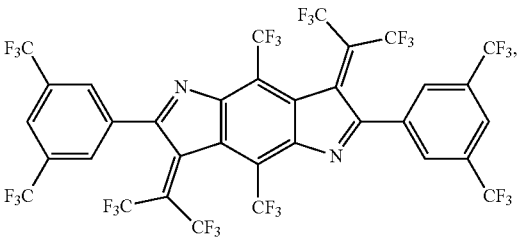
C1-35
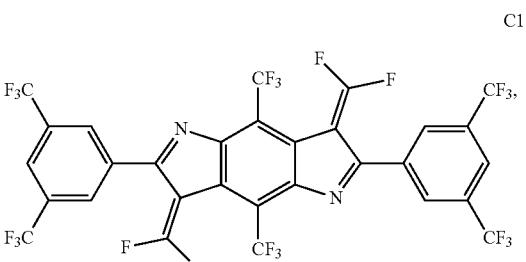
C1-36
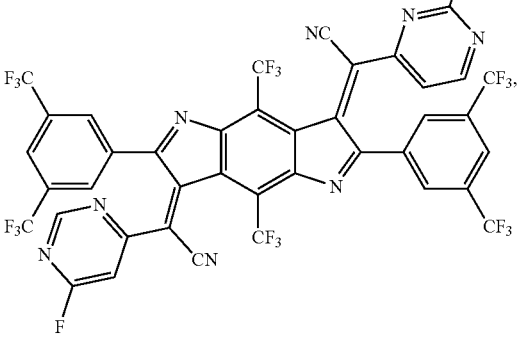
C1-37
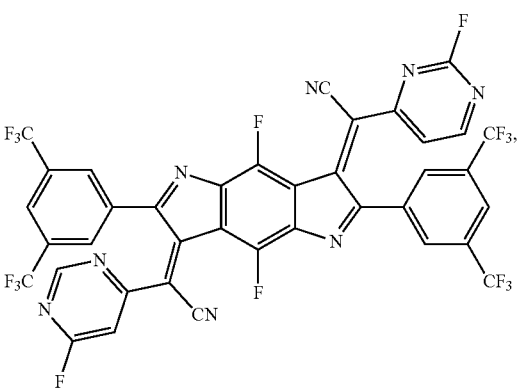

C1-38
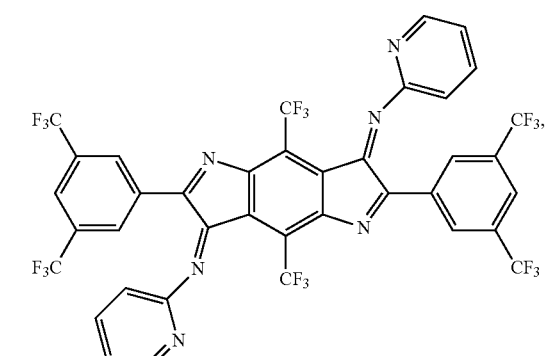
C1-39
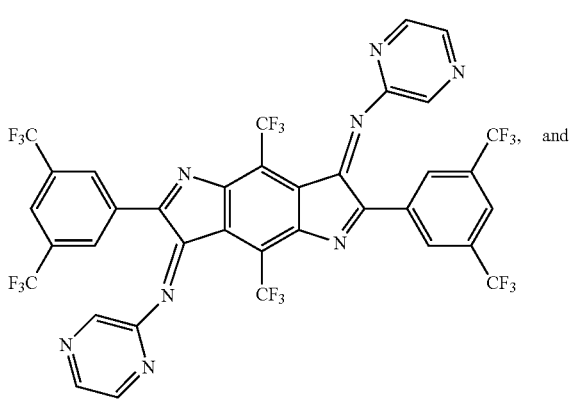
and
C1-40
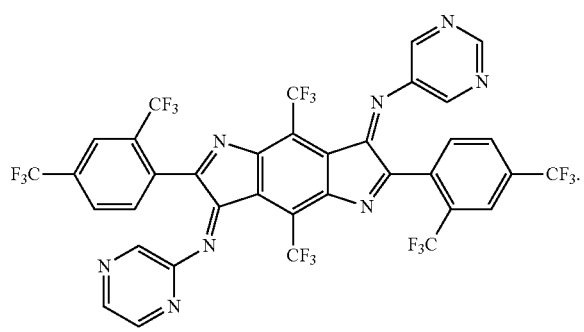
12. The organic compound according to claim 1, wherein the organic compound is selected from any one of the following compounds:
C2-9
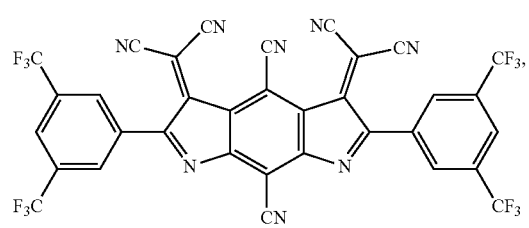
C2-10
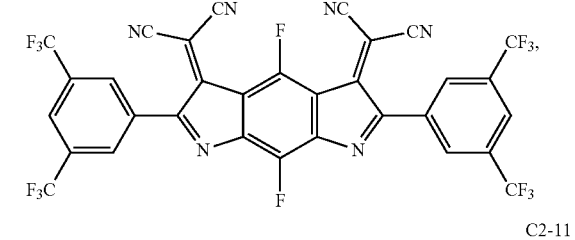
C2-11
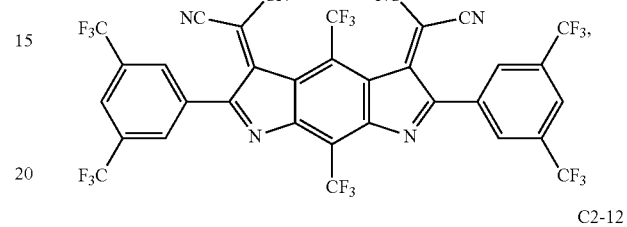
C2-12
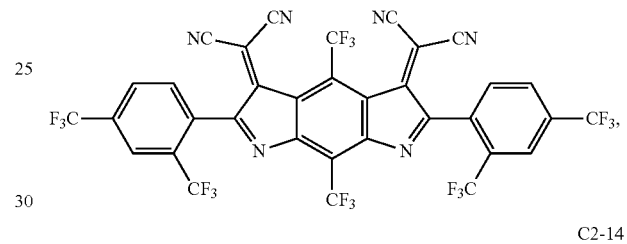
C2-14
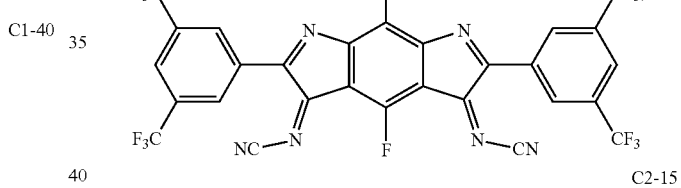
C2-15
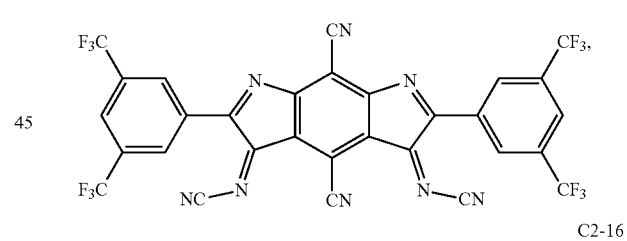
C2-16
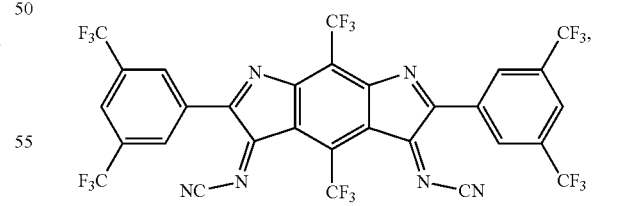
C2-18
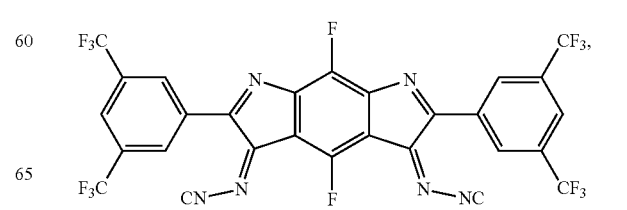

-continued

C2-19
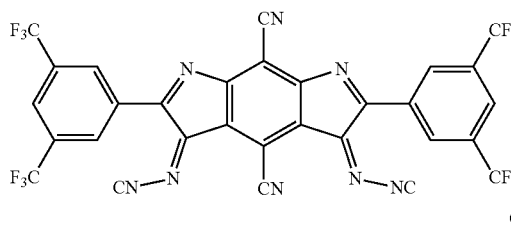

C2-20
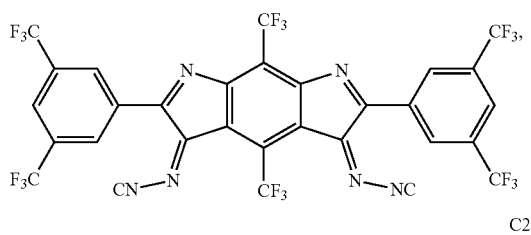

C2-22
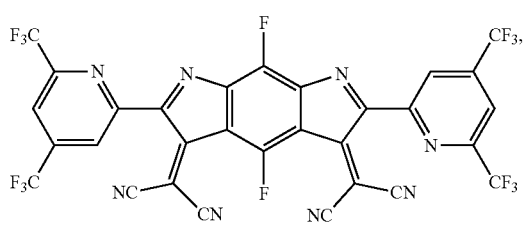

C2-23
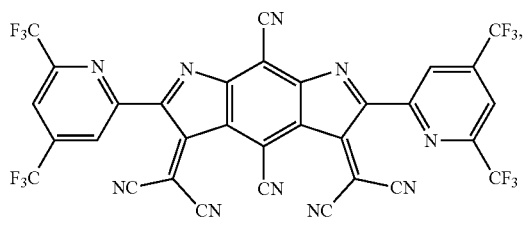

C2-24
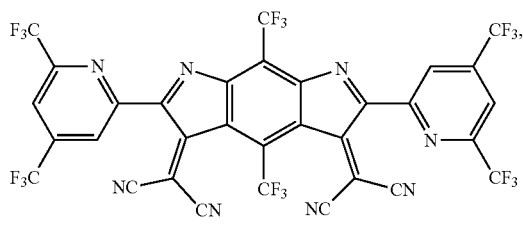

C2-26
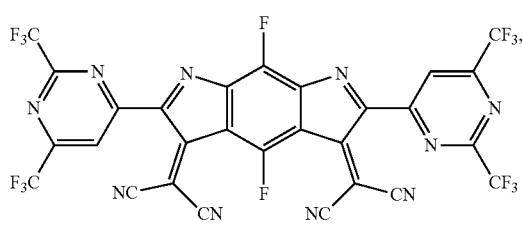

C2-27
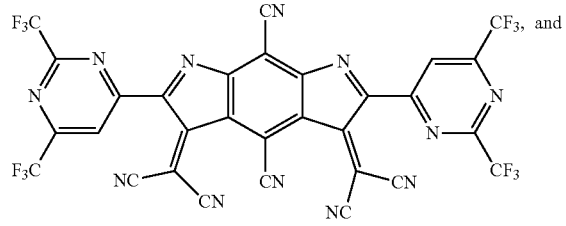

C2-28
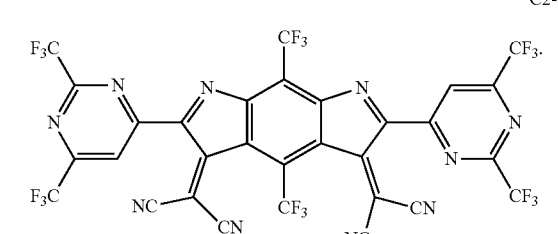

13. A hole injection material, comprising an organic compound, wherein the organic compound having a structure as shown in Formula I or Formula II:

Formula I
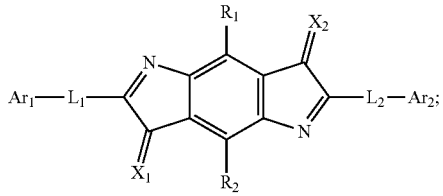

Formula II
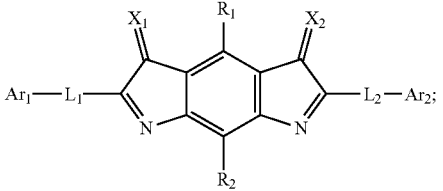

wherein $X_1$ and $X_2$ are each independently selected from NR' or CR"R'";

wherein R', R", and R'" are electron withdrawing groups and each independently selected from any one of halogen, a cyano group, an isocyano group, a $R^{X1}$-substituted C1 to C20 linear or branched alkyl group, a $R^{X1}$-substituted C1 to C20 alkoxyl group, a $R^{X2}$-substituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, or a substituted or unsubstituted C6 to C30 arylphosphonoxy group;

wherein $R^{X1}$ is selected from fluorine, a cyano group or an isocyano group;

wherein $R^{X2}$ is selected from any one of fluorine, a cyano group, an isocyano group, a fluorine-substituted C1 to C20 alkoxyl, or a fluorine-substituted C1 to C20 linear or branched alkyl group;

wherein $L_1$ and $L_2$ are each independently selected from any one of a single bond, a substituted or unsubstituted C6 to C30 arylene group, or a substituted or unsubstituted C3 to C30 heteroarylene group;

wherein $R_1$ and $R_2$ are each independently selected from any one of halogen, a cyano group, a substituted or unsubstituted C1 to C20 linear or branched alkyl group, a substituted or unsubstituted C3 to C20 cycloalkyl group, a substituted or unsubstituted C6 to C30 aryl group, a substituted or unsubstituted C3 to C30 heteroaryl group, a substituted or unsubstituted C6 to C30 aryl keto group, a substituted or unsubstituted C4 to C30 heteroaryl keto group, a substituted or unsubstituted C6 to C30 arylsulfone group, a substituted or unsubstituted C6 to C30 arylphosphonoxy group, a substituted or unsubstituted C3 to C20 alkylsilyl group, or a substituted or unsubstituted C6 to C30 arylsilyl group; and wherein $Ar_1$ and $Ar_2$ are each independently selected from any one of the following groups:

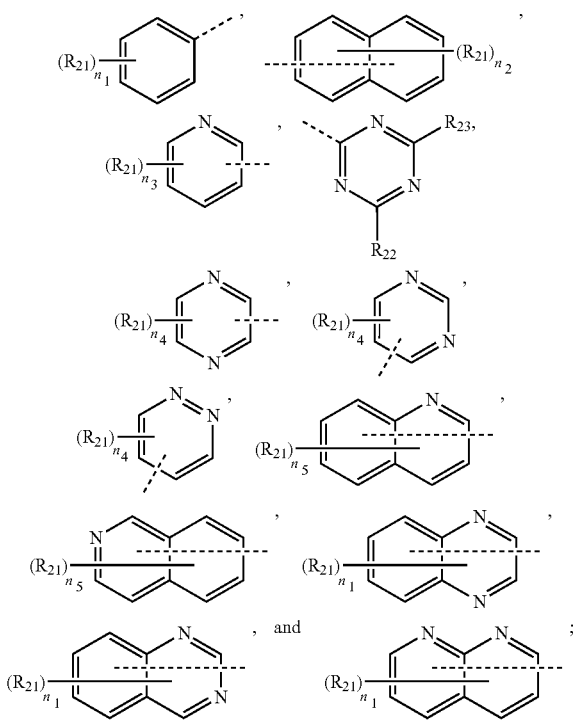

wherein the dashed line represents a linkage site of a group;

wherein $R_{21}$ is selected from any one of halogen, a cyano group, an isocyano group, an unsubstituted or $R^{X3}$-substituted C1 to C10 linear or branched alkyl group, an unsubstituted or $R^{X3}$-substituted C1 to C10 alkoxyl group, an unsubstituted or $R^{X3}$-substituted C1 to C10 alkylthio group, an unsubstituted or $R^{X3}$-substituted C6 to C18 aryl group, or an unsubstituted or $R^{X3}$-substituted C3 to C18 heteroaryl group;

wherein $R_{22}$ and $R_{23}$ are each independently selected from any one of hydrogen, deuterium, halogen, a cyano group, an isocyano group, an unsubstituted or $R^{X3}$-substituted C1 to C10 linear or branched alkyl group, an unsubstituted or $R^{X3}$-substituted C1 to C10 alkoxyl group, an unsubstituted or $R^{X3}$-substituted C1 to C10 alkylthio group, an unsubstituted or $R^{X3}$-substituted C6 to C18 aryl group, or an unsubstituted or $R^{X3}$-substituted C3 to C18 heteroaryl group;

wherein $R^{X3}$ is selected from any one of halogen, a cyano group or an isocyano group;

wherein $n_1$ is an integer selected from 1 to 5;

wherein $n_2$ is an integer selected from 0 to 7;

wherein $n_3$ is an integer selected from 0 to 4;

wherein $n_4$ is an integer selected from 0 to 3; and wherein $n_5$ is an integer selected from 0 to 6.

14. The hole injection material according to claim 13, wherein the hole injection material comprises a combination of a matrix material and a P-type dopant; wherein the P-type dopant comprises the organic compound.

15. An OLED device, comprising an anode, a cathode, and an organic thin film layer located between the anode and the cathode, wherein the material of the organic thin film layer comprises the hole injection material according to claim 13.

16. The OLED device according to claim 15, wherein the organic thin film layer comprises a light emitting layer, and a hole injection layer is arranged between the light emitting layer and the anode; wherein a material of the hole injection layer comprises the hole injection material.

17. A display panel, comprising the OLED device according to claim 15.

* * * * *